(12) United States Patent
Mao et al.

(10) Patent No.: US 11,839,065 B2
(45) Date of Patent: Dec. 5, 2023

(54) TEMPERATURE EQUALIZING VEHICLE-MOUNTABLE DEVICE

(71) Applicant: HUAWEI TECHNOLOGIES CO., LTD., Guangdong (CN)

(72) Inventors: Yonghai Mao, Dongguan (CN); Zhenming Hu, Hangzhou (CN); Jianqiang Yin, Dongguan (CN); Xiaofei Li, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/574,766

(22) Filed: Jan. 13, 2022

(65) Prior Publication Data

US 2022/0142010 A1 May 5, 2022

Related U.S. Application Data

(63) Continuation of application No. PCT/CN2020/112120, filed on Aug. 28, 2020.

(30) Foreign Application Priority Data

Aug. 30, 2019 (CN) .......................... 201910812636.9

(51) Int. Cl.
*H05K 7/20* (2006.01)
*H05K 1/02* (2006.01)

(52) U.S. Cl.
CPC ....... *H05K 7/20872* (2013.01); *H05K 1/0203* (2013.01); *H05K 7/20172* (2013.01);
(Continued)

(58) Field of Classification Search
CPC .......... H05K 7/20845–20881; H05K 7/20254; H05K 7/20436; H05K 7/20454;
(Continued)

(56) References Cited

U.S. PATENT DOCUMENTS

| 7,336,487 B1 * | 2/2008 | Chrysler | H01L 23/473 361/679.48 |
| 7,855,891 B1 * | 12/2010 | Ayres, III | H05K 7/20445 174/547 |

(Continued)

FOREIGN PATENT DOCUMENTS

| CN | 101325862 A | 12/2008 |
| CN | 202168313 U | 3/2012 |

(Continued)

*Primary Examiner* — Zachary Pape
(74) *Attorney, Agent, or Firm* — HUAWEI TECHNOLOGIES CO., LTD.

(57) ABSTRACT

This application discloses a vehicle-mounted device comprising: a first temperature equalization board and a PCB are fastened inside a housing. The first temperature equalization board is close to a first inner wall of the housing. The PCB is close to a second inner wall of the housing. The first inner wall is opposite to the second inner wall. A first protrusion is disposed on a side that is of the first temperature equalization board and that is close to the PCB. A first heat pipe is disposed on a side that is of the first temperature equalization board and that is close to the first inner wall. A first heat emission component is disposed on a side that is of the PCB and that is close to the first temperature equalization board. A position of the first protrusion corresponds to a position of the first heat emission component.

16 Claims, 6 Drawing Sheets

(52) U.S. Cl.
CPC ..... *H05K 7/20854* (2013.01); *H05K 7/20881* (2013.01); *H05K 7/20254* (2013.01); *H05K 7/20336* (2013.01); *H05K 7/20454* (2013.01); *H05K 7/20863* (2013.01)

(58) Field of Classification Search
CPC ........... H05K 7/20509; H05K 7/20336; H05K 7/20172; H05K 1/0203; H01L 23/427; H01L 23/473
See application file for complete search history.

(56) References Cited

U.S. PATENT DOCUMENTS

| | | | | |
|---|---|---|---|---|
| 7,961,471 | B2* | 6/2011 | Odanaka | G06F 1/20 174/547 |
| 8,681,501 | B2* | 3/2014 | Govindasamy | G06F 1/203 174/16.3 |
| 9,010,141 | B2* | 4/2015 | Harrington | F28D 15/0233 62/169 |
| 9,013,874 | B2* | 4/2015 | Kaldani | F28F 3/048 361/679.52 |
| 10,645,848 | B1* | 5/2020 | Lu | H05K 7/20854 |
| 2003/0161110 | A1* | 8/2003 | Spasevski | H05K 7/20854 361/715 |
| 2005/0128710 | A1* | 6/2005 | Beitelmal | H05K 7/20445 361/709 |
| 2015/0230363 | A1* | 8/2015 | Dernier | H05K 7/2049 174/548 |
| 2017/0120719 | A1 | 5/2017 | Chang et al. | |
| 2017/0273218 | A1 | 9/2017 | Stoermer et al. | |
| 2019/0053403 | A1 | 2/2019 | Lin et al. | |
| 2019/0171258 | A1 | 6/2019 | Rice et al. | |
| 2021/0251102 | A1* | 8/2021 | Lu | H05K 7/20445 |

FOREIGN PATENT DOCUMENTS

| | | |
|---|---|---|
| CN | 202884731 U | 4/2013 |
| CN | 203607389 U | 5/2014 |
| CN | 203934263 U | 11/2014 |
| CN | 204350126 U | 5/2015 |
| CN | 105511577 A | 4/2016 |
| CN | 206165063 U | 5/2017 |
| CN | 207678163 U | 7/2018 |
| CN | 110557931 A | 12/2019 |
| JP | S527424 U | 3/1977 |
| JP | H09226280 A | 9/1997 |
| JP | 2002231867 A | 8/2002 |
| JP | 2010130011 A | 6/2010 |
| JP | 2010267912 A | 11/2010 |
| JP | 2011003606 A | 1/2011 |
| JP | 2014003258 A | 1/2014 |
| JP | 2016189415 A | 11/2016 |
| JP | 2017079226 A | 4/2017 |
| WO | 2011116526 A1 | 9/2011 |

\* cited by examiner

TEMPERATURE EQUALIZING VEHICLE-MOUNTABLE DEVICE

CROSS-REFERENCE TO RELATED APPLICATIONS

This application is a continuation of International Application No. PCT/CN2020/112120, filed on Aug. 28, 2020, which claims priority to Chinese Patent Application No. 201910812636.9, filed on Aug. 30, 2019. The disclosures of the aforementioned applications are hereby incorporated by reference in their entireties.

TECHNICAL FIELD

This application relates to the field of heat dissipation technologies, and in particular, to a vehicle-mounted device and a vehicle.

BACKGROUND

A vehicle-mounted device is various electronic devices installed on a vehicle, and the vehicle-mounted device includes many components (such as a chip, a resistor, and a capacitor). When the vehicle-mounted device works, the components emit heat to the outside. As a self-driving level is continuously improved, an increasingly high requirement is imposed on computing power of the vehicle-mounted device, and an increasingly big challenge is also posed to heat dissipation of the vehicle-mounted device.

A vehicle-mounted device in a related technology includes a housing and a printed circuit board (PCB). A component on which heat dissipation needs to be performed is disposed on the PCB, a protrusion is disposed on an inner wall of the housing, and a heat pipe is disposed on an outer wall. A heat dissipation principle of the vehicle-mounted device in the related technology is described as follows: The protrusion is in contact with the component that is on the PCB and on which heat dissipation needs to be performed, to conduct heat of the component to the housing. Then, the heat pipe disperses the heat conducted to the housing, so that the heat is dispersed on the housing as evenly as possible. Finally, the heat on the housing is dissipated to an external environment to complete heat dissipation of the vehicle-mounted device.

A related technology has at least the following problem:
The heat pipe is disposed on the outer wall of the housing, is in direct contact with the external environment, and is easily damaged.

SUMMARY

Embodiments of this application provide a vehicle-mounted device and a vehicle, to resolve a technical problem in a related technology.

An embodiment of this application provides a vehicle-mounted device. The vehicle-mounted device includes a housing, a first temperature equalization board, and a PCB. The first temperature equalization board and the PCB are fastened inside the housing. The first temperature equalization board is close to a first inner wall of the housing. The PCB is close to a second inner wall of the housing. The first inner wall is opposite to the second inner wall. A first protrusion is disposed on a side that is of the first temperature equalization board and that is close to the PCB. A first heat pipe is disposed on a side that is of the first temperature equalization board and that is close to the first inner wall. A first heat emission component is disposed on a side that is of the PCB and that is close to the first temperature equalization board. A position of the first protrusion corresponds to a position of the first heat emission component.

The vehicle-mounted device may be various electronic devices installed on a vehicle. Optionally, the vehicle-mounted device may be a vehicle-mounted intelligent computing platform.

The housing is a housing of the vehicle-mounted device, and may include two separated housing parts, namely, a first housing part and a second housing part. The first inner wall and the second inner wall are two opposite inner walls of the housing, and the first inner wall and the second inner wall may be located on different housing parts. For example, the first inner wall is located on the first housing part, and the second inner wall is located on the second housing part. The housing may be made of aluminum.

The first temperature equalization board is a thermally conductive board with the first protrusion disposed on one side and the first heat pipe disposed on the other side. A board body of the temperature equalization board may be made of aluminum. A size of the first temperature equalization board matches a layout of the first heat emission component, and the first temperature equalization board may cover all first heat emission components. Optionally, the first temperature equalization board is 240 mm long, 150 mm wide, and 3.5 mm thick.

The first protrusion is a protrusion on the first temperature equalization board, and there may be a plurality of first protrusions. The first protrusion is in direct contact with the first heat emission component or is in contact with the first heat emission component by using a thermally conductive member, to conduct heat generated by the first heat emission component to the first temperature equalization board.

The first heat pipe is a heat pipe used for thermal conduction, namely, a heat transfer element produced by using a heat pipe technology. The first heat pipe has a strong thermal conduction capability, and can quickly disperse, on each part of the first temperature equalization board, the heat conducted to the first temperature equalization board. In a possible implementation, there are a plurality of first heat pipes. An arrangement manner of the first heat pipe on the first temperature equalization board may be that the first heat pipe passes through a high-temperature first heat emission component, that is, the first heat pipe directly faces one or more first heat emission components whose heating powers are greater than a target power threshold. In other words, when the vehicle-mounted device is assembled, the first heat pipe is directly located above or below the one or more first heat emission components whose heating powers are greater than the target power threshold. The first heat pipe may be welded or crimped to the board body of the first temperature equalization board. Specifically, the first heat pipe may be welded to the board body of the first temperature equalization board through soldering. More specifically, the first heat pipe may be welded to a solder bath of the board body of the first temperature equalization board through soldering.

The PCB may be a main board, and a plurality of first heat emission components may be disposed on the side that is of the PCB and that is close to the first temperature equalization board.

The first heat emission component is a component that can generate heat and that is disposed on the side, of the PCB, close to the first temperature equalization board. Specifically, the first heat emission component may be various chips, capacitors, and resistors. In a possible implementation, the first heat emission component is all components that can generate heat and that are on the side, of the PCB, close to the first temperature equalization board. In this case, a corresponding first protrusion needs to be disposed on the first temperature equalization board for each component that generates heat. In another possible implementation, the first heat emission component is a component whose heating power is greater than the target power threshold and that is on the side, of the PCB, close to the first temperature equalization board. In this case, a corresponding first protrusion needs to be disposed on the first temperature equalization board only for the component whose heating power is greater than a preset power threshold. Optionally, the preset power threshold is 100 W.

A quantity of first protrusions may be equal to a quantity of first heat emission components. In this case, a position of each first protrusion corresponds to a position of one first heat emission component. Alternatively, a quantity of first protrusions may be less than a quantity of first heat emission components. In this case, a position of each first protrusion corresponds to a position of one or more first heat emission components.

In the solution shown in this embodiment of this application, when heat dissipation is performed for the vehicle-mounted device provided in this embodiment of this application, the heat generated by the first heat emission component is conducted to the first temperature equalization board by using the first protrusion. Then, the first heat pipe disperses the heat conducted to the first temperature equalization board, and the heat on the first temperature equalization board is conducted to the housing. Finally, the heat conducted to the housing is dissipated to an external environment to complete heat dissipation. The first temperature equalization board is added inside the vehicle-mounted device provided in this embodiment of this application, and the first heat pipe is disposed on the first temperature equalization board, so that the first heat pipe is not in direct contact with the external environment, thereby reducing a possibility that the first heat pipe is damaged. Even if the vehicle-mounted device is in an external corrosive environment, the first heat pipe is not easily damaged. Therefore, the vehicle-mounted device provided in this embodiment of this application can meet a corrosion-resistance requirement in an outdoor environment. In addition, because the first heat pipe disperses the heat conducted to the first temperature equalization board, the heat conducted to the housing is relatively even, and the heat is also dissipated to the external environment quickly, that is, heat dissipation efficiency of the vehicle-mounted device is relatively high.

Next, in a related technology, a heat pipe generally needs to be welded to a housing of a vehicle-mounted device. A specific technology is as follows: First, tinning is performed in a solder bath of the housing, and then the heat pipe is welded to the solder bath by using a soldering technology. To enhance corrosion resistance of the housing, paint usually needs to be baked on the housing. Because temperature of paint baking is about 200° C., and a melting point of tin is about 120° C., the previous solder is usually melted during paint baking, causing an unstable connection between the heat pipe and the housing. As a result, the vehicle-mounted device in the related technology has poor machinability. However, because no heat pipe is disposed on the housing of the vehicle-mounted device provided in this embodiment of this application, baking paint on the housing has no adverse impact. In addition, because the first temperature equalization board is disposed inside the vehicle-mounted device, paint does not need to be baked on the first temperature equalization board. Therefore, welding between the first heat pipe and the board body of the first temperature equalization board is not affected, and a connection between the first heat pipe and the board body of the first temperature equalization board is relatively stable. Therefore, the vehicle-mounted device provided in this embodiment of this application has better machinability.

In addition, the vehicle-mounted device provided in this embodiment of this application also facilitates upgrading of the PCB. That is, when the PCB needs to be upgraded, arrangement and a quantity of first heat emission components on the PCB may change. In this case, only the first temperature equalization board needs to be replaced. Therefore, only the first temperature equalization board needs to be redesigned, and the entire vehicle-mounted device does not need to be redesigned. Therefore, the vehicle-mounted device provided in this embodiment of this application facilitates upgrading of the PCB.

Further, the first heat pipe and the first protrusion are disposed on two sides instead of a same side of the first temperature equalization board, so that the first heat pipe is prevented from interfering with the first protrusion, thereby facilitating a high-density design of the first protrusion, and improving heat dissipation performance of the vehicle-mounted device.

To improve a heat dissipation effect, the first protrusion may be in direct contact with the first heat emission component, or a thermally conductive member may be disposed between the first protrusion and the first heat emission component. Similarly, the first temperature equalization board may be in direct contact with the first inner wall, or a thermally conductive member may be disposed between the first temperature equalization board and the first inner wall.

In a possible implementation, the first protrusion is in contact with the first heat emission component.

In the solution shown in this embodiment of this application, a plurality of first protrusions may be disposed on the side that is of the first temperature equalization board and that is close to the PCB, and a plurality of first heat emission components may be disposed on the side that is of the PCB and that is close to the first temperature equalization board. A quantity of the plurality of first protrusions may be equal to a quantity of the plurality of first heat emission components. In this case, each first protrusion is in contact with one first heat emission component. Alternatively, a quantity of the plurality of first protrusions may be less than a quantity of the plurality of first heat emission components. In this case, each first protrusion may be in contact with one or more first heat emission components.

The first protrusion is in direct contact with the first heat emission component without disposing another additional component, so that a quantity of components included in the vehicle-mounted device is reduced, and assembly of the vehicle-mounted device is more convenient.

In a possible implementation, the vehicle-mounted device further includes a first thermally conductive member, the first thermally conductive member is disposed between the first heat emission component and the first protrusion, and two sides of the first thermally conductive member are respectively in contact with the first heat emission component and the first protrusion.

The first thermally conductive member may be a flexible thermally conductive member. Specifically, the first thermally conductive member may be a thermally conductive pad, or may be a thermally conductive silicone grease film.

In the solution shown in this embodiment of this application, a plurality of first protrusions may be disposed on the side that is of the first temperature equalization board and that is close to the PCB, and a plurality of first heat emission components may be disposed on the side that is of the PCB and that is close to the first temperature equalization board.

A quantity of the plurality of first protrusions may be equal to a quantity of the plurality of first heat emission components. In this case, each first protrusion corresponds to a position of one first heat emission component. When the first thermally conductive member is a thermally conductive pad, a thermally conductive pad is disposed between each first protrusion and one first heat emission component. When the first thermally conductive member is a thermally conductive silicone grease film, each first protrusion may be coated with a layer of thermally conductive silicone grease film, each first heat emission component may be coated with a layer of thermally conductive silicone grease film, or each first protrusion and each first heat emission component may be both coated with a layer of thermally conductive silicone grease film.

Alternatively, a quantity of the plurality of first protrusions may be less than a quantity of the plurality of first heat emission components. In this case, each first protrusion may correspond to a position of one or more first heat emission components. When the first thermally conductive member is a thermally conductive pad, a thermally conductive pad may be disposed between each first protrusion and one or more first heat emission components, and a size of the thermally conductive pad matches a size of a corresponding first protrusion. Alternatively, thermally conductive pads of a same quantity as the first heat emission components may be disposed between each first protrusion and one or more first heat emission components. In this case, a thermally conductive pad is disposed on each first heat emission component. When the first thermally conductive member is a thermally conductive silicone grease film, each first protrusion may be coated with a layer of thermally conductive silicone grease film, each first heat emission component may be coated with a layer of thermally conductive silicone grease film, or each first protrusion and each first heat emission component may be both coated with a layer of thermally conductive silicone grease film.

The first thermally conductive member is disposed between the first protrusion and the first heat emission component, so that thermal conductivity between the first heat emission component and the first protrusion is improved, the heat generated by the first heat emission component can be conducted to the first temperature equalization board quickly, and heat dissipation efficiency of the vehicle-mounted device is improved.

In addition, the flexible first thermally conductive member is disposed between the first protrusion and the first heat emission component, so that a flatness error of the first protrusion can be absorbed. That is, if the flexible first thermally conductive member is not disposed between the first protrusion and the first heat emission component, because a protrusion surface of the first protrusion cannot be a totally flat plane, it is difficult for the first protrusion to be in total contact with the first heat emission component, and a gap inevitably exists. The existing gap may be filled by adding the flexible first thermally conductive member, so that the first thermally conductive member can absorb the flatness error of the first protrusion, and the first protrusion and the first heat emission component are closer to each other. In addition, the characteristic of filling the gap by using the first thermally conductive member also improves thermal conductivity between the first protrusion and the first heat emission component.

In a possible implementation, the first temperature equalization board is in contact with the first inner wall.

In the solution shown in this embodiment of this application, the first temperature equalization board is in direct in contact with the first inner wall without disposing another component, so that a quantity of components included in the vehicle-mounted device is reduced, and assembly of the vehicle-mounted device is more convenient.

In a possible implementation, the vehicle-mounted device further includes a second thermally conductive member, the second thermally conductive member is disposed between the first temperature equalization board and the first inner wall, and two sides of the second thermally conductive member are respectively in contact with the first temperature equalization board and the first inner wall.

The second thermally conductive member is a flexible thermally conductive member. Specifically, the second thermally conductive member may be a thermally conductive pad, or may be a thermally conductive silicone grease film. There may be one second thermally conductive member. An area of the second thermally conductive member may match an area of the side that is of the first temperature equalization board and on which the first heat pipe is disposed. Specifically, the area of the second thermally conductive member is equal to the area of the side that is of the first temperature equalization board and on which the first heat pipe is disposed.

In the solution shown in this embodiment of this application, the second thermally conductive member is disposed between the first inner wall and the first temperature equalization board, so that thermal conductivity between the first inner wall and the first temperature equalization board is improved, and the heat on the first temperature equalization board can be conducted to the first inner wall quickly and then conducted to the housing, thereby improving heat dissipation efficiency of the vehicle-mounted device.

In addition, the flexible second thermally conductive member is disposed between the first inner wall and the first temperature equalization board, so that a flatness error between the first inner wall and the first temperature equalization board can be absorbed. That is, if the flexible second thermally conductive member is not disposed between the first inner wall and the first temperature equalization board, because a contact surface of the first inner wall and the first temperature equalization board cannot be a totally flat plane, it is difficult for the first inner wall to be in total contact with the first temperature equalization board, and a gap inevitably exists. The existing gap may be filled by adding the flexible second thermally conductive member, so that the second thermally conductive member can absorb the flatness error between the first inner wall and the first temperature equalization board, and the first inner wall and the first temperature equalization board are closer to each other. In addition, the characteristic of filling the gap by using the second thermally conductive member also improves thermal conductivity between the first inner wall and the first temperature equalization board.

When the second thermally conductive member is a thermally conductive pad, the thermally conductive pad needs to be placed between the first inner wall and the first temperature equalization board during assembly of the vehicle-mounted device. When the second thermally conductive member is a thermally conductive silicone grease film, during assembly of the vehicle-mounted device, the first inner wall needs to be coated with thermally conductive silicone grease, the side that is of the first temperature equalization board and that is close to the first inner wall needs to be coated with thermally conductive silicone grease, or both the first inner wall and the first temperature equalization board need to be coated with thermally conductive silicone grease.

In a possible implementation, a second heat emission component is disposed on a side that is of the PCB and that is close to the second inner wall. A second protrusion is disposed on the second inner wall. A position of the second protrusion corresponds to a position of the second heat emission component.

The second heat emission component is a component that can generate heat and that is disposed on the side, of the PCB, close to the second inner wall. Specifically, the second heat emission component may be various chips, capacitors, and resistors. In a possible implementation, the second heat emission component is all components that can generate heat and that are on the side, of the PCB, close to the second inner wall. In this case, a corresponding second protrusion needs to be disposed on the second inner wall for each component that generates heat. In another possible implementation, the second heat emission component is a component whose heating power is greater than the target power threshold and that is on the side, of the PCB, close to the second inner wall. In this case, a corresponding second protrusion needs to be disposed on the second inner wall only for the component whose heating power is greater than the preset power threshold. Optionally, the preset power threshold is 100 W.

The second protrusion is a protrusion on the second inner wall, and there may be a plurality of second protrusions. The second protrusion is in direct contact with the second heat emission component or is in contact with the second heat emission component by using a thermally conductive member, to conduct heat generated by the second heat emission component to the housing.

A quantity of second protrusions may be equal to a quantity of second heat emission components. In this case, a position of each second protrusion corresponds to a position of one second heat emission component. Alternatively, a quantity of second protrusions may be less than a quantity of second heat emission components. In this case, a position of each second protrusion corresponds to a position of one or more second heat emission components.

In the solution shown in this embodiment of this application, the second protrusion is disposed on the second inner wall, so that the heat generated by the second heat emission component can be conducted to the housing by using the second protrusion, thereby accelerating heat dissipation of the second heat emission component, and improving heat dissipation efficiency of the vehicle-mounted device.

To improve a heat dissipation effect, the second protrusion may be in direct contact with the second heat emission component, or a thermally conductive member may be disposed between the second protrusion and the second heat emission component.

In a possible implementation, the second protrusion is in contact with the second heat emission component.

In the solution shown in this embodiment of this application, a plurality of second protrusions may be disposed on the second inner wall, and a plurality of second heat emission components are disposed on the side that is of the PCB and that is close to the second inner wall.

A quantity of the plurality of second protrusions may be equal to a quantity of the plurality of second heat emission components. In this case, each second protrusion is in contact with one second heat emission component. Alternatively, a quantity of the plurality of second protrusions may be less than a quantity of the plurality of second heat emission components. In this case, each second protrusion may be in contact with one or more second heat emission components.

The second protrusion is in direct contact with the second heat emission component without disposing another additional component, so that a quantity of components included in the vehicle-mounted device is reduced, and assembly of the vehicle-mounted device is more convenient.

In a possible implementation, the vehicle-mounted device further includes a third thermally conductive member, the third thermally conductive member is disposed between the second protrusion and the second heat emission component, and two sides of the third thermally conductive member are respectively in contact with the second protrusion and the second heat emission component.

The third thermally conductive member may be a flexible thermally conductive member. Specifically, the third thermally conductive member may be a thermally conductive pad, or may be a thermally conductive silicone grease film.

In the solution shown in this embodiment of this application, a plurality of second protrusions may be disposed on the second inner wall, and a plurality of second heat emission components are disposed on the side that is of the PCB and that is close to the second inner wall.

A quantity of the plurality of second protrusions may be equal to a quantity of the plurality of second heat emission components. In this case, each second protrusion corresponds to a position of one second heat emission component. When the third thermally conductive member is a thermally conductive pad, a thermally conductive pad is disposed between each second protrusion and one second heat emission component. When the third thermally conductive member is a thermally conductive silicone grease film, each second protrusion may be coated with a layer of thermally conductive silicone grease film, each second heat emission component may be coated with a layer of thermally conductive silicone grease film, or each second protrusion and each second heat emission component may be both coated with a layer of thermally conductive silicone grease film.

Alternatively, a quantity of the plurality of second protrusions may be less than a quantity of the plurality of second heat emission components. In this case, each second protrusion may correspond to a position of one or more second heat emission components. When the third thermally conductive member is a thermally conductive pad, a thermally conductive pad may be disposed between each second protrusion and one or more second heat emission components, and a size of the thermally conductive pad matches a size of a corresponding second protrusion. Alternatively, thermally conductive pads of a same quantity as the second heat emission components may be disposed between each second protrusion and one or more second heat emission components. In this case, a thermally conductive pad is disposed on each second heat emission component. When the third thermally conductive member is a thermally conductive silicone grease film, each second protrusion may be coated with a layer of thermally conductive silicone grease film, each second heat emission component may be coated with a layer of thermally conductive silicone grease film, or each second protrusion and each second heat emission component may be both coated with a layer of thermally conductive silicone grease film.

In addition, the flexible third thermally conductive member is disposed between the second protrusion and the second heat emission component, so that a flatness error of the second protrusion can be absorbed. That is, if the flexible third thermally conductive member is not disposed between the second protrusion and the second heat emission component, because a protrusion surface of the second protrusion cannot be a totally flat plane, it is difficult for the second protrusion to be in total contact with the second heat emission component, and a gap inevitably exists. The existing gap may be filled by adding the flexible third thermally conductive member, so that the third thermally conductive member can absorb the flatness error of the second protrusion, and the second protrusion and the second heat emission component are closer to each other. In addition, the characteristic of filling the gap by using the third thermally conductive member also improves thermal conductivity between the second protrusion and the second heat emission component.

In a possible implementation, the vehicle-mounted device further includes a second temperature equalization board. The second temperature equalization board is fastened between the PCB and the second inner wall. A second heat emission component is disposed on a side that is of the PCB and that is close to the second temperature equalization board. A second heat pipe is disposed on a side that is of the second temperature equalization board and that is close to the second inner wall, and a third protrusion is disposed on a side that is of the second temperature equalization board and that is close to the PCB. A position of the third protrusion corresponds to a position of the second heat emission component.

The second temperature equalization board is a thermally conductive board with the third protrusion disposed on one side and the second heat pipe disposed on the other side. A board body of the temperature equalization board may be made of aluminum. A size of the second temperature equalization board matches a layout of the second heat emission component, and the second temperature equalization board may cover all second heat emission components.

Similar to the first heat pipe, the second heat pipe is a heat pipe used for thermal conduction, namely, a heat transfer element produced by using a heat pipe technology. The second heat pipe has a strong thermal conduction capability, and can quickly disperse, on each part of the second temperature equalization board, heat conducted to the second temperature equalization board. In a possible implementation, there are a plurality of second heat pipes. An arrangement manner of the second heat pipe on the second temperature equalization board may be that the second heat pipe passes through a high-temperature second heat emission component, that is, the second heat pipe directly faces one or more second heat emission components whose heating powers are greater than the target power threshold. In other words, when the vehicle-mounted device is assembled, the second heat pipe is directly located above or below the one or more second heat emission components whose heating powers are greater than the target power threshold. The second heat pipe may be welded or crimped to the board body of the second temperature equalization board.

The third protrusion is a protrusion on the second temperature equalization board, and there may be a plurality of third protrusions. The third protrusion is in direct contact with the second heat emission component or is in contact with the second heat emission component by using a thermally conductive member, to conduct heat generated by the second heat emission component to the second temperature equalization board.

A quantity of third protrusions may be equal to a quantity of second heat emission components. In this case, a position of each third protrusion corresponds to a position of one second heat emission component. Alternatively, a quantity of third protrusions may be less than a quantity of second heat emission components. In this case, a position of each third protrusion corresponds to a position of one or more second heat emission components.

In the solution shown in this embodiment of this application, when the second heat emission component has relatively high heating efficiency, the second temperature equalization board is disposed between the second inner wall and the PCB, thereby improving heat dissipation efficiency on the second heat emission component.

In the solution shown in this embodiment of this application, the first temperature equalization board and the second temperature equalization board are added inside the vehicle-mounted device provided in this embodiment of this application, the first heat pipe is disposed on the first temperature equalization board, and the second heat pipe is disposed on the second temperature equalization board, so that the first heat pipe and the second heat pipe are not in direct contact with the external environment, thereby reducing a possibility that the first heat pipe and the second heat pipe are damaged. Even if the vehicle-mounted device is in an external corrosive environment, the first heat pipe and the second heat pipe are not easily damaged. Therefore, the vehicle-mounted device provided in this embodiment of this application can meet a corrosion-resistance requirement in an outdoor environment. In addition, because the first heat pipe disperses the heat conducted to the first temperature equalization board, and the second heat pipe disperses the heat conducted to the second temperature equalization board, the heat conducted to the housing is relatively even, and the heat is also dissipated to the external environment quickly, that is, heat dissipation efficiency of the vehicle-mounted device is relatively high.

Next, in a related technology, a heat pipe generally needs to be welded to a housing of a vehicle-mounted device. A specific technology is as follows: First, tinning is performed in a solder bath of the housing, and then the heat pipe is welded to the solder bath by using a soldering technology. To enhance corrosion resistance of the housing, paint usually needs to be baked on the housing. Because temperature of paint baking is about 200° C., and a melting point of tin is about 120° C., the previous solder is usually melted during paint baking, causing an unstable connection between the heat pipe and the housing. As a result, the vehicle-mounted device in the related technology has poor machinability. However, because no heat pipe is disposed on the housing of the vehicle-mounted device provided in this embodiment of this application, baking paint on the housing has no adverse impact. In addition, because the first temperature equalization board and the second temperature equalization board are disposed inside the vehicle-mounted device, paint does not need to be baked on the first temperature equalization board and the second temperature equalization board. Therefore, welding between the first heat pipe and the board body of the first temperature equalization board and welding between the second heat pipe and the board body of the second temperature equalization board are not affected, and a connection between the first heat pipe and the board body of the first temperature equalization board and a connection between the second heat pipe and the board body of the second temperature equalization board are relatively stable. Therefore, the vehicle-mounted device provided in this embodiment of this application has better machinability.

In addition, the vehicle-mounted device provided in this embodiment of this application also facilitates upgrading of the PCB. That is, when the PCB needs to be upgraded, arrangement and quantities of first heat emission components and second heat emission components on the PCB may change. In this case, only the first temperature equalization board and/or the second temperature equalization board need/needs to be replaced. Therefore, only the first temperature equalization board and/or the second temperature equalization board need/needs to be redesigned, and the entire vehicle-mounted device does not need to be redesigned. Therefore, the vehicle-mounted device provided in this embodiment of this application facilitates upgrading of the PCB.

Further, the second heat pipe and the third protrusion are disposed on two sides of the second temperature equalization board, so that the second heat pipe is prevented from interfering with the third protrusion, thereby facilitating a high-density design of the third protrusion, and improving heat dissipation performance of the vehicle-mounted device.

To improve a heat dissipation effect, the third protrusion may be in direct contact with the second heat emission component, or may be in contact with the second heat emission component by using a thermally conductive pad. Similarly, the second temperature equalization board may be in direct contact with the second inner wall, or may be in contact with the second inner wall by using a thermally conductive pad.

In a possible implementation, the third protrusion is in contact with the second heat emission component.

In the solution shown in this embodiment of this application, a plurality of third protrusions may be disposed on the side that is of the second temperature equalization board and that is close to the PCB, and a plurality of second heat emission components may be disposed on the side that is of the PCB and that is close to the second temperature equalization board.

A quantity of the plurality of third protrusions may be equal to a quantity of the plurality of second heat emission components. In this case, each third protrusion is in contact with one second heat emission component. Alternatively, a quantity of the plurality of third protrusions may be less than a quantity of the plurality of second heat emission components. In this case, each third protrusion may be in contact with one or more second heat emission components.

The third protrusion is in direct contact with the second heat emission component without disposing another additional component, so that a quantity of components included in the vehicle-mounted device is reduced, and assembly of the vehicle-mounted device is more convenient.

In a possible implementation, the vehicle-mounted device further includes a fourth thermally conductive member, the fourth thermally conductive member is disposed between the third protrusion and the second heat emission component, and two sides of the fourth thermally conductive member are respectively in contact with the third protrusion and the second heat emission component.

The fourth thermally conductive member may be a flexible thermally conductive member. Specifically, the fourth thermally conductive member may be a thermally conductive pad, or may be a thermally conductive silicone grease film.

In the solution shown in this embodiment of this application, a plurality of third protrusions may be disposed on the side that is of the second temperature equalization board and that is close to the PCB, and a plurality of second heat emission components may be disposed on the side that is of the PCB and that is close to the second temperature equalization board.

A quantity of the plurality of third protrusions may be equal to a quantity of the plurality of second heat emission components. In this case, each third protrusion corresponds to a position of one second heat emission component. When the fourth thermally conductive member is a thermally conductive pad, a thermally conductive pad is disposed between each third protrusion and one second heat emission component. When the fourth thermally conductive member is a thermally conductive silicone grease film, each third protrusion may be coated with a layer of thermally conductive silicone grease film, each second heat emission component may be coated with a layer of thermally conductive silicone grease film, or each third protrusion and each second heat emission component may be both coated with a layer of thermally conductive silicone grease film.

Alternatively, a quantity of the plurality of third protrusions may be less than a quantity of the second heat emission components. In this case, each third protrusion may correspond to a position of one or more second heat emission components. When the fourth thermally conductive member is a thermally conductive pad, a thermally conductive pad may be disposed between each third protrusion and one or more second heat emission components, and a size of the thermally conductive pad matches a size of a corresponding third protrusion. Alternatively, thermally conductive pads of a same quantity as the second heat emission components may be disposed between each third protrusion and one or more second heat emission components. In this case, a thermally conductive pad is disposed on each second heat emission component. When the fourth thermally conductive member is a thermally conductive silicone grease film, each third protrusion may be coated with a layer of thermally conductive silicone grease film, each second heat emission component may be coated with a layer of thermally conductive silicone grease film, or each third protrusion and each second heat emission component may be both coated with a layer of thermally conductive silicone grease film.

The fourth thermally conductive member is disposed between the third protrusion and the second heat emission component, so that thermal conductivity between the second heat emission component and the third protrusion is improved, the heat generated by the second heat emission component can be conducted to the second temperature equalization board quickly, and heat dissipation efficiency of the vehicle-mounted device is improved.

In addition, the flexible fourth thermally conductive member is disposed between the third protrusion and the second heat emission component, so that a flatness error of the third protrusion can be absorbed. That is, if the flexible fourth thermally conductive member is not disposed between the third protrusion and the second heat emission component, because a protrusion surface of the third protrusion cannot be a totally flat plane, it is difficult for the third protrusion to be in total contact with the second heat emission component, and a gap inevitably exists. The existing gap may be filled by adding the flexible fourth thermally conductive member, so that the fourth thermally conductive member can absorb the flatness error of the third protrusion, and the third protrusion and the second heat emission component are closer to each other. In addition, the characteristic of filling the gap by using the fourth thermally conductive member also improves thermal conductivity between the third protrusion and the second heat emission component.

In a possible implementation, the second temperature equalization board is in contact with the second inner wall.

In the solution shown in this embodiment of this application, the second temperature equalization board is in direct in contact with the second inner wall without disposing another component, so that a quantity of components included in the vehicle-mounted device is reduced, and assembly of the vehicle-mounted device is more convenient.

In a possible implementation, the vehicle-mounted device further includes a fifth thermally conductive member, the fifth thermally conductive member is disposed between the second temperature equalization board and the second inner wall, and two sides of the fifth thermally conductive member are respectively in contact with the second temperature equalization board and the second inner wall.

The fifth thermally conductive member is a flexible thermally conductive member. Specifically, the fifth thermally conductive member may be a thermally conductive pad, or may be a thermally conductive silicone grease film. There may be one fifth thermally conductive member. A surface area of the fifth thermally conductive member may match an area of the side that is of the second temperature equalization board and on which the second heat pipe is disposed. Specifically, the area of the fifth thermally conductive member is equal to the area of the side that is of the second temperature equalization board and on which the second heat pipe is disposed.

In the solution shown in this embodiment of this application, the fifth thermally conductive member is disposed between the second inner wall and the second temperature equalization board, so that thermal conductivity between the second inner wall and the second temperature equalization board is improved, and the heat on the second temperature equalization board can be conducted to the second inner wall quickly and then conducted to the housing, thereby improving heat dissipation efficiency of the vehicle-mounted device.

In addition, the flexible fifth thermally conductive member is disposed between the second inner wall and the second temperature equalization board, so that a flatness error between the second inner wall and the second temperature equalization board can be absorbed. That is, if the flexible fifth thermally conductive member is not disposed between the second inner wall and the second temperature equalization board, because a contact surface of the second inner wall and the second temperature equalization board cannot be a totally flat plane, it is difficult for the second inner wall to be in total contact with the second temperature equalization board, and a gap inevitably exists. The existing gap may be filled by adding the flexible fifth thermally conductive member, so that the fifth thermally conductive member can absorb the flatness error between the second inner wall and the second temperature equalization board, and the second inner wall and the second temperature equalization board are closer to each other. In addition, the characteristic of filling the gap by using the fifth thermally conductive member also improves thermal conductivity between the second inner wall and the second temperature equalization board.

When the fifth thermally conductive member is a thermally conductive pad, the thermally conductive pad needs to be placed between the second inner wall and the second temperature equalization board during assembly of the vehicle-mounted device. When the fifth thermally conductive member is a thermally conductive silicone grease film, during assembly of the vehicle-mounted device, the second inner wall needs to be coated with thermally conductive silicone grease, the side that is of the second temperature equalization board and that is close to the second inner wall needs to be coated with thermally conductive silicone grease, or both the second inner wall and the second temperature equalization board need to be coated with thermally conductive silicone grease.

In a possible implementation, the first heat pipe directly faces a first heat emission component whose heating power is greater than the target power threshold.

The first heat pipe directly faces the first heat emission component whose heating power is greater than the target power threshold. In other words, the first heat pipe is located directly above the first heat emission component whose heating power is greater than the target power threshold, that is, passes through the first heat emission component whose heating power is greater than the target power threshold. Therefore, heat emitted by the first heat emission component whose heating power is greater than the target power threshold can be conducted to the first heat pipe more quickly.

In the solution shown in this embodiment of this application, the first heat pipe directly faces a first heat emission component with a relatively high heating power, so that heat generated by the first heat emission component with the relatively high heating power can be conducted to the first heat pipe more quickly, and the first heat pipe can quickly disperse absorbed heat onto the board body of the first temperature equalization board, thereby further facilitating heat dissipation of the vehicle-mounted device.

In a possible implementation, there are one or more first heat emission components, and there are one or more first protrusions. A quantity of first protrusions is the same as a quantity of first heat emission components, and a position of each first protrusion corresponds to a position of one first heat emission component. Alternatively, a quantity of first protrusions is less than a quantity of first heat emission components, and a position of each first protrusion corresponds to a position of one or more first heat emission components.

In a possible implementation, the housing includes the first housing part and the second housing part, and the first housing part and the second housing part are fixedly connected. The first inner wall is located on the first housing part, and the second inner wall is located on the second housing part.

In the solution shown in this embodiment of this application, the first temperature equalization board may be fastened to the first housing part, and the PCB may be fastened to the second housing part. Then, the first housing part and the second housing part are fixedly connected, to complete assembly of the entire vehicle-mounted device.

It should be noted that when the vehicle-mounted device includes the second temperature equalization board, the second temperature equalization board may be fastened to the second housing part.

In a possible implementation, the first temperature equalization board and the first inner wall are fixedly connected.

In the solution shown in this embodiment of this application, the first temperature equalization board and the first inner wall are fixedly connected to each other by using a screw, that is, the first temperature equalization board is fastened to an inner wall of the first housing part by using a screw.

Correspondingly, when the vehicle-mounted device includes the second temperature equalization board, the second temperature equalization board and the second inner wall may be fixedly connected to each other by using a screw, that is, the second temperature equalization board is fastened to an inner wall of the second housing part by using a screw.

The first temperature equalization board and the second temperature equalization board are fastened by using screws, so that the first temperature equalization board and the second temperature equalization board have better detachability. Therefore, it is convenient to replace a corresponding temperature equalization board when the PCB is upgraded or the temperature equalization board is damaged.

In a possible implementation, a plurality of fins are disposed on an outer wall of the first housing part.

The fins may also be referred to as heat sinks, and the fins are metallic plates. The fins are disposed on the first housing part, so that a heat dissipation area of the first housing part can be increased, thereby improving heat dissipation efficiency of the vehicle-mounted device.

In the solution shown in this embodiment of this application, a plurality of fins are disposed on the outer wall of the first housing part, so that the heat dissipation area of the first housing part is increased, thereby improving heat dissipation efficiency of the vehicle-mounted device.

When the second heat emission component has a relatively small heating power, fins may not need to be disposed on an outer wall of the second housing part, thereby reducing a difficulty of a technology of producing the second housing part, and reducing a cost. When the second heat emission component has a relatively large heating power, fins may also be disposed on an outer wall of the second housing part, thereby improving heat dissipation efficiency of the vehicle-mounted device.

In a possible implementation, the vehicle-mounted device further includes a fan, and the fan is fastened to an outer wall of the housing. The fan is configured to accelerate heat dissipation of the housing.

In the solution shown in this embodiment of this application, the vehicle-mounted device provided in this embodiment of this application may be a natural air-cooling vehicle-mounted device, or may be a mechanical air-cooling vehicle-mounted device.

When the vehicle-mounted device is a mechanical air-cooling vehicle-mounted device, the vehicle-mounted device may further include a fan, and the fan is installed on the outer wall of the housing, and accelerates heat dissipation of the housing by blowing air. In a possible implementation, the fan is installed on the first housing part, an installation slot is disposed on an outer wall of the first housing part, the fan is installed in the installation slot, and air blown by the fan accelerates heat dissipation of fins.

It should be noted that another case exists: When the vehicle-mounted device is a mechanical air-cooling vehicle-mounted device, the vehicle-mounted device may not include a fan. In this case, the vehicle-mounted device performs mechanical air cooling by using a fan included in the vehicle.

In a possible implementation, a sealed cavity is formed between the first inner wall and the first temperature equalization board, and the sealed cavity is configured to hold coolant. A liquid inlet and a liquid outlet are disposed on the sealed cavity.

The coolant may be water. The liquid inlet is configured to enable the coolant to flow in, and the liquid outlet is configured to enable the coolant to flow out.

In the solution shown in this embodiment of this application, the vehicle-mounted device provided in this embodiment of this application may not include a liquid cooling apparatus, but uses a liquid cooling apparatus included in the vehicle. During installation, a liquid outlet pipe of the liquid cooling apparatus is connected to the liquid inlet of the sealed cavity, and a liquid return pipe of the liquid cooling apparatus is connected to the liquid outlet of the sealed cavity. During working, a working process of a cooling part of the vehicle-mounted device is as follows: The coolant absorbs heat to become coolant with relatively high temperature, then enters the liquid cooling apparatus for cooling by using the liquid outlet and the liquid return pipe to become coolant with relatively low temperature, and re-enters the sealed cavity by using the liquid outlet pipe and the liquid inlet to absorb heat generated by the vehicle-mounted device.

Heat dissipation is performed for the vehicle-mounted device provided in this application through liquid cooling. Liquid-cooling heat dissipation has a better effect than air-cooling heat dissipation.

In a possible implementation, the vehicle-mounted device further includes a liquid cooling apparatus, and the liquid cooling apparatus includes a liquid outlet pipe and a liquid return pipe. The liquid outlet pipe is connected to the liquid inlet, and the liquid return pipe is connected to the liquid outlet.

The liquid cooling apparatus may be a conventional cooling apparatus.

In the solution shown in this embodiment of this application, the vehicle-mounted device provided in this embodiment of this application may further include a liquid cooling apparatus. The liquid outlet pipe of the liquid cooling apparatus is connected to the liquid inlet of the sealed cavity, and the liquid return pipe of the liquid cooling apparatus is connected to the liquid outlet of the sealed cavity. During working, a working process of a cooling part of the vehicle-mounted device is as follows: The coolant absorbs heat to become coolant with relatively high temperature, then enters the liquid cooling apparatus for cooling by using the liquid outlet and the liquid return pipe to become coolant with relatively low temperature, and re-enters the sealed cavity by using the liquid outlet pipe and the liquid inlet to absorb heat generated by the vehicle-mounted device.

The liquid cooling apparatus includes a pump, a water tank, and a cooler, and the components are connected to each other by using a pipeline. Heat dissipation is performed for the vehicle-mounted device provided in this embodiment of this application through liquid cooling. Liquid-cooling heat dissipation has a better effect than air-cooling heat dissipation.

An embodiment of this application further provides a vehicle, where the vehicle is installed with the vehicle-mounted device in any one of the foregoing implementations.

The vehicle may be any vehicle in which a vehicle-mounted device may be installed.

In the solution shown in this embodiment of this application, the foregoing vehicle-mounted device is installed, so that the vehicle-mounted device has relatively high heat dissipation efficiency. Therefore, computing power of the vehicle-mounted device can be greatly improved, thereby further facilitating implementation of self-driving of the vehicle.

For descriptions of the vehicle-mounted device, refer to the foregoing content. Details are not described herein again.

The technical solutions provided in the embodiments of this application bring at least the following beneficial effects:

When heat dissipation is performed for the vehicle-mounted device provided in the embodiments of this application, the heat generated by the first heat emission component is conducted to the first temperature equalization board by using the first protrusion. Then, the first heat pipe disperses the heat conducted to the first temperature equalization board, and the heat on the first temperature equalization board is conducted to the housing. Finally, the heat conducted to the housing is dissipated to the external environment to complete heat dissipation. The first temperature equalization board is added inside the vehicle-mounted device provided in the embodiments of this application, and the first heat pipe is disposed on the first temperature equalization board, so that the first heat pipe is not in direct contact with the external environment, thereby reducing a possibility that the first heat pipe is damaged.

Figure 1:
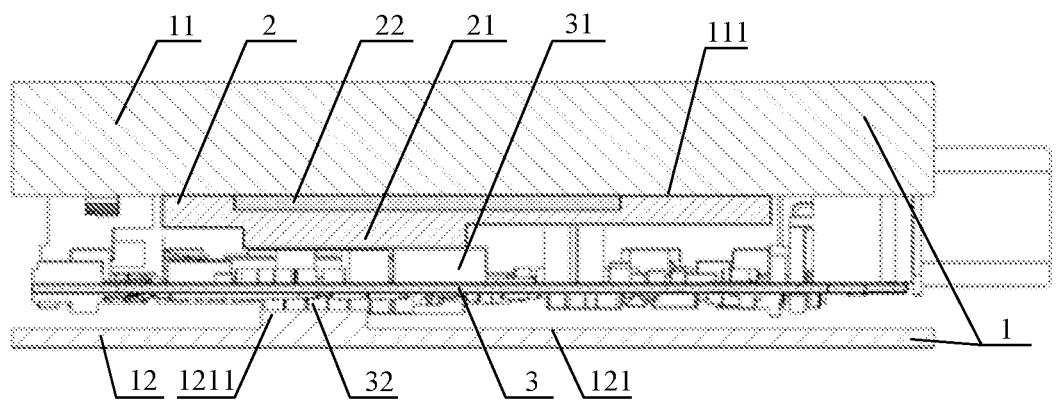
FIG. 1 is a schematic diagram of an internal structure of a vehicle-mounted device according to an embodiment of this application.

REFERENCE NUMERALS 1. housing, 11. first housing part, 12. second housing part, 111. first inner wall, 121. second inner wall, 1211. second protrusion, 2. first temperature equalization board, 21. first protrusion, 22. first heat pipe, 3. PCB, 31. first heat emission component, 32. second heat emission component, 4. first thermally conductive member, 5. second thermally conductive member, 6. third thermally conductive member, 7. second temperature equalization board, 71. second heat pipe, 72. third protrusion, 8. fourth thermally conductive member, 9. fifth thermally conductive member, 10. fan, and 13. liquid cooling apparatus.

DESCRIPTION OF EMBODIMENTS

Embodiments of this application provide a vehicle-mounted device and a vehicle. The vehicle-mounted device provided in the embodiments of this application may be applied to various vehicles. The vehicle-mounted device includes a housing (1), a first temperature equalization board (2), and a PCB (3). A first protrusion (21) is disposed on one side of the first temperature equalization board (2), and a first heat pipe (22) is disposed on the other side. A first heat emission component (31) is disposed on the PCB (3). The first protrusion (21) is in contact with the first heat emission component (31), or is in contact with the first heat emission component (31) by using a thermally conductive member. When heat dissipation is performed for the vehicle-mounted device, heat generated by the first heat emission component (31) is conducted to the first temperature equalization board (2) by using the first protrusion (21). Then, the first heat pipe (22) disperses the heat conducted to the first temperature equalization board (2), and the heat on the first temperature equalization board (2) is conducted to the housing (1) to complete an entire heat dissipation process. Because the first heat pipe (22) disperses the heat conducted to the first temperature equalization board (2), the heat conducted to the housing (1) is relatively even, and the heat on the housing (1) may be dissipated to an external environment quickly.

An embodiment of this application provides a vehicle-mounted device. The vehicle-mounted device includes a housing (1), a first temperature equalization board (2), and a PCB (3). The first temperature equalization board (2) and the PCB (3) are fastened inside the housing (1). The first temperature equalization board (2) is close to a first inner wall of the housing (1). The PCB (3) is close to a second inner wall (121) of the housing (1). The first inner wall (111) is opposite to the second inner wall (121). A first protrusion (21) is disposed on a side that is of the first temperature equalization board (2) and that is close to the PCB (3), and a first heat pipe (22) is disposed on a side that is of the first temperature equalization board (2) and that is close to the first inner wall (111). A first heat emission component (31) is disposed on a side that is of the PCB (3) and that is close to the first temperature equalization board (2). A position of the first protrusion (21) corresponds to a position of the first heat emission component (31).

The vehicle-mounted device may be various electronic devices installed on a vehicle. Optionally, the vehicle-mounted device may be a vehicle-mounted intelligent computing platform.

The housing (1) is a housing of the vehicle-mounted device, and may include two separated housing parts, namely, a first housing part (11) and a second housing part (12). The first inner wall (111) and the second inner wall (121) are two opposite inner walls of the housing (1), and the first inner wall (111) and the second inner wall (121) may be located on different housing parts. For example, the first inner wall (111) is located on the first housing part (11), and the second inner wall (121) is located on the second housing part (12). The housing (1) may be made of aluminum.

Figure 4:
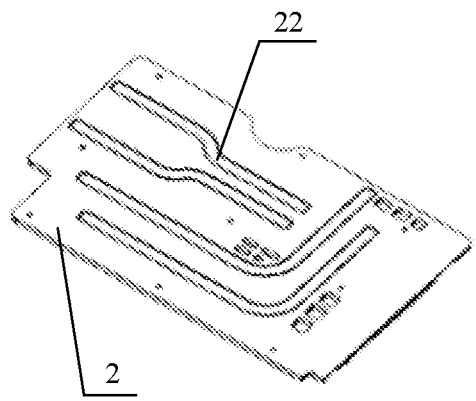
FIG. 4 is a schematic diagram of a first temperature equalization board (2) according to an embodiment of this application.
Figure 5:
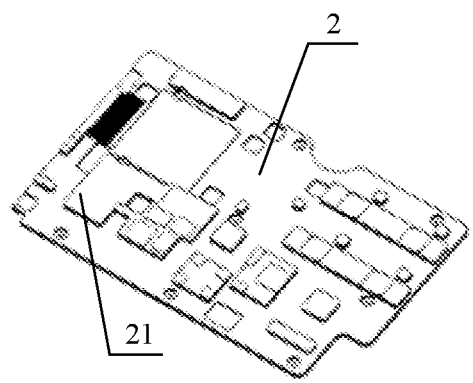
FIG. 5 is a schematic diagram of a first temperature equalization board (2) according to an embodiment of this application.
Figure 6:
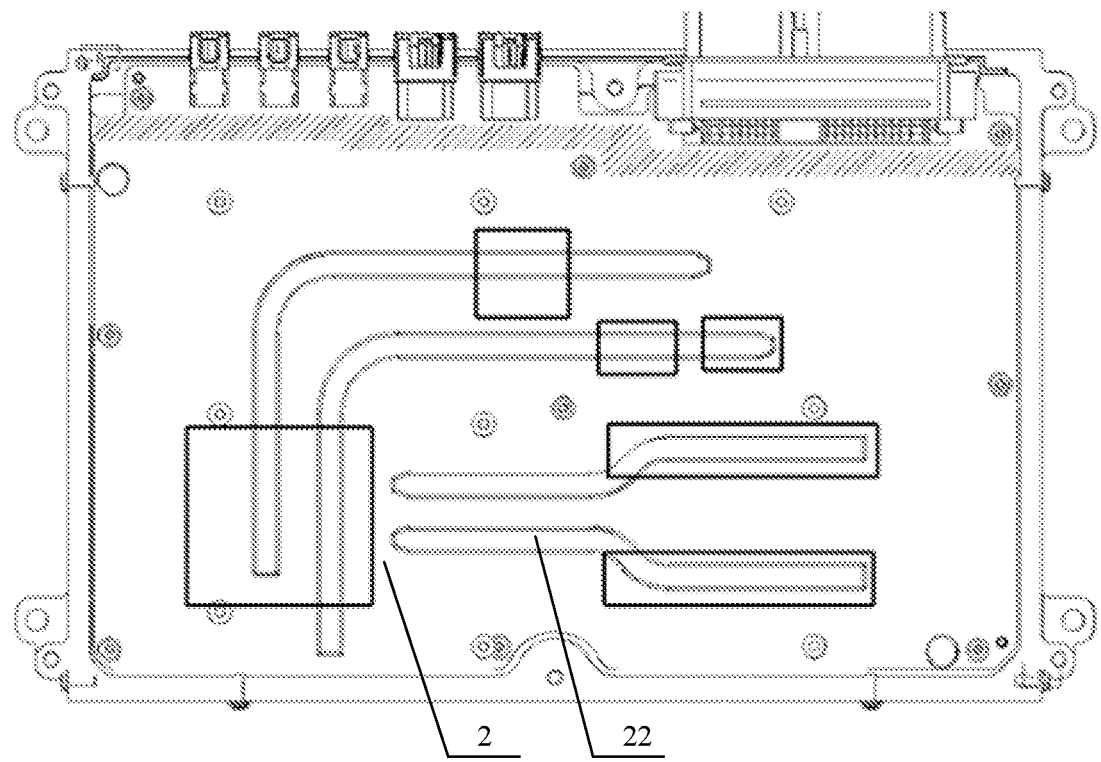
FIG. 6 is a schematic diagram of installation of a first temperature equalization board (2) according to an embodiment of this application.
Figure 7:
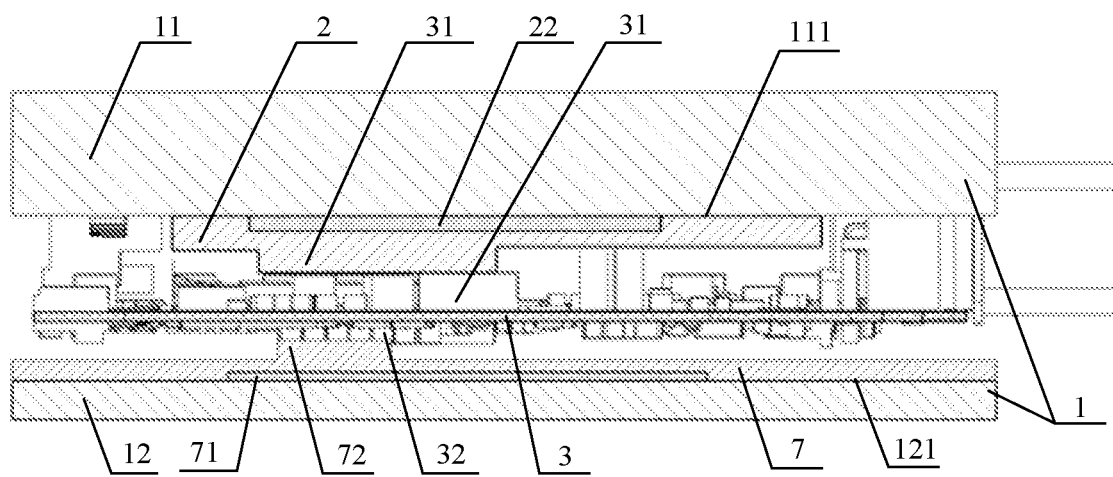
FIG. 7 is a schematic diagram of an internal structure of a vehicle-mounted device according to an embodiment of this application.
Figure 8:
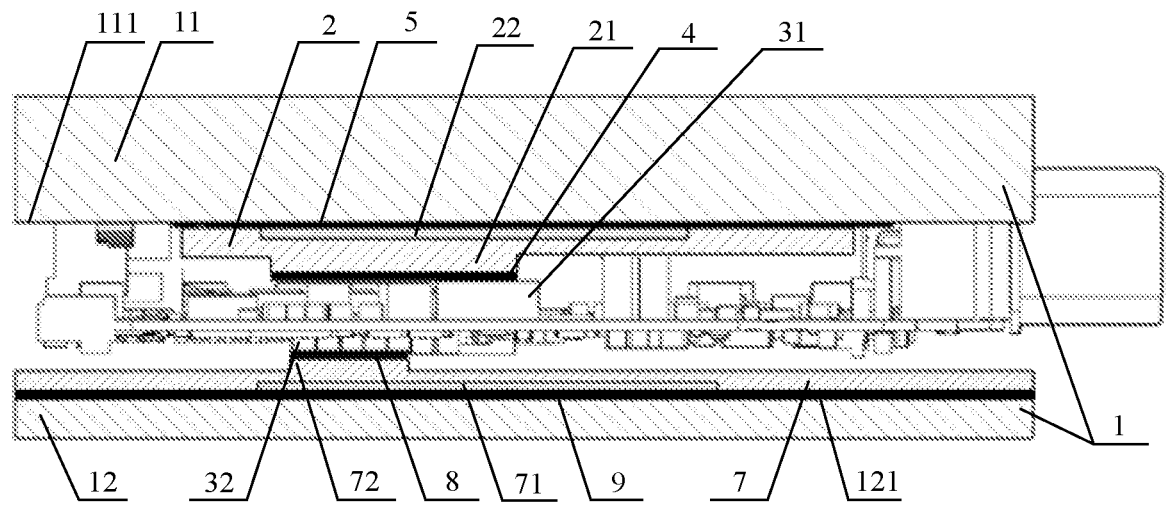
FIG. 8 is a schematic diagram of an internal structure of a vehicle-mounted device according to an embodiment of this application.

As shown in FIG. 4 and FIG. 5, the first temperature equalization board (2) is a thermally conductive board with the first protrusion (21) disposed on one side and the first heat pipe (22) disposed on the other side. A board body of the temperature equalization board may be made of aluminum. A size of the first temperature equalization board (2) matches a layout of the first heat emission component (31), and the first temperature equalization board (2) may cover all first heat emission components (31). Optionally, the first temperature equalization board is 240 mm long, 150 mm wide, and 3.5 mm thick.

The first protrusion (21) is a protrusion on the first temperature equalization board (2), and there may be a plurality of first protrusions (21). The first protrusion (21) is in direct contact with the first heat emission component (31) or is in contact with the first heat emission component (31) by using a thermally conductive member, to conduct heat generated by the first heat emission component (31) to the first temperature equalization board (2).

The first heat pipe (22) is a heat pipe used for thermal conduction, namely, a heat transfer element produced by using a heat pipe technology. The first heat pipe (22) has a strong thermal conduction capability, and can quickly disperse, on each part of the first temperature equalization board (2), the heat conducted to the first temperature equalization board (2). In a possible implementation, there are a plurality of first heat pipes (22). An arrangement manner of the first heat pipe (22) on the first temperature equalization board (2) may be that the first heat pipe (22) passes through a first heat emission component (31) whose heating power is relatively high, that is, the first heat pipe (22) directly faces one or more first heat emission components (31) whose heating powers are greater than a target power threshold. In other words, when the vehicle-mounted device is assembled, the first heat pipe (22) is directly located above or below the one or more first heat emission components (31) whose heating powers are greater than the target power threshold. The first heat pipe (22) may be welded or crimped to the board body of the first temperature equalization board (2). Specifically, the first heat pipe (22) may be welded to the board body of the first temperature equalization board (2) through soldering. More specifically, the first heat pipe (22) may be welded to a solder bath of the board body of the first temperature equalization board (2) through soldering.

Figure 3:
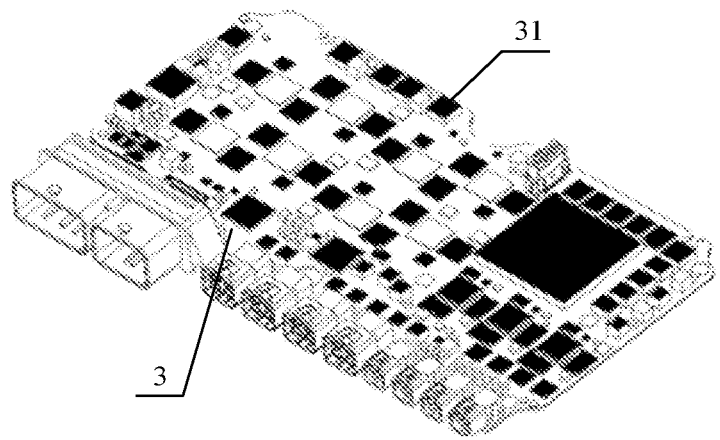
FIG. 3 is a schematic diagram of a PCB (3) according to an embodiment of this application.

As shown in FIG. 3, the PCB (3) may be a main board, and a plurality of first heat emission components (31) may be disposed on the side that is of the PCB (3) and that is close to the first temperature equalization board (2).

The first heat emission component (31) is a component that can generate heat and that is disposed on the side, of the PCB (3), close to the first temperature equalization board (2). Specifically, the first heat emission component (31) may be various chips, capacitors, and resistors. In a possible implementation, the first heat emission component (31) is all components that can generate heat and that are on the side, of the PCB (3), close to the first temperature equalization board (2). In this case, a corresponding first protrusion (21) needs to be disposed on the first temperature equalization board (2) for each component that generates heat. In another possible implementation, the first heat emission component (31) is a component whose heating power is greater than the target power threshold and that is on the side, of the PCB (3), close to the first temperature equalization board (2). In this case, a corresponding first protrusion (21) needs to be disposed on the first temperature equalization board (2) only for the component whose heating power is greater than a preset power threshold. Optionally, the preset power threshold is 100 W.

A quantity of first protrusions (21) may be equal to a quantity of first heat emission components (31). In this case, a position of each first protrusion (21) corresponds to a position of one first heat emission component (31). Alternatively, a quantity of first protrusions (21) may be less than a quantity of first heat emission components (31). In this case, a position of each first protrusion (21) corresponds to a position of one or more first heat emission components (31).

In the solution shown in this embodiment of this application, when heat dissipation is performed for the vehicle-mounted device provided in this embodiment of this application, the heat generated by the first heat emission component (31) is conducted to the first temperature equalization board (2) by using the first protrusion (21). Then, the first heat pipe (22) disperses the heat conducted to the first temperature equalization board (2), and the heat on the first temperature equalization board (2) is conducted to the housing (1). Finally, the heat conducted to the housing (1) is dissipated to an external environment to complete heat dissipation. The first temperature equalization board (2) is added inside the vehicle-mounted device provided in this embodiment of this application, and the first heat pipe (22) is disposed on the first temperature equalization board (2), so that the first heat pipe (22) is not in direct contact with the external environment, thereby reducing a possibility that the first heat pipe (22) is damaged. Even if the vehicle-mounted device is in an external corrosive environment, the first heat pipe (22) is not easily damaged. Therefore, the vehicle-mounted device provided in this embodiment of this application can meet a corrosion-resistance requirement in an outdoor environment. In addition, because the first heat pipe (22) disperses the heat conducted to the first temperature equalization board (2), the heat conducted to the housing (1) is relatively even, and the heat is also dissipated to the external environment quickly, that is, heat dissipation efficiency of the vehicle-mounted device is relatively high.

Next, in a related technology, a heat pipe generally needs to be welded to a housing of a vehicle-mounted device. A specific technology is as follows: First, tinning is performed in a solder bath of the housing, and then the heat pipe is welded to the solder bath by using a soldering technology. To enhance corrosion resistance of the housing, paint usually needs to be baked on the housing. Because temperature of paint baking is about 200° C., and a melting point of tin is about 120° C., the previous solder is usually melted during paint baking, causing an unstable connection between the heat pipe and the housing. As a result, the vehicle-mounted device in the related technology has poor machinability. However, because no heat pipe is disposed on the housing (1) of the vehicle-mounted device provided in this embodiment of this application, baking paint on the housing (1) has no adverse impact. In addition, because the first temperature equalization board (2) is disposed inside the vehicle-mounted device, paint does not need to be baked on the first temperature equalization board (2). Therefore, welding between the first heat pipe (22) and the board body of the first temperature equalization board (2) is not affected, and a connection between the first heat pipe (22) and the board body of the first temperature equalization board (2) is relatively stable. Therefore, the vehicle-mounted device provided in this embodiment of this application has better machinability.

In addition, the vehicle-mounted device provided in this embodiment of this application also facilitates upgrading of the PCB (3). That is, when the PCB (3) needs to be upgraded, arrangement and a quantity of first heat emission components (31) on the PCB (3) may change. In this case, only the first temperature equalization board (2) needs to be replaced. Therefore, only the first temperature equalization board (2) needs to be redesigned, and the entire vehicle-mounted device does not need to be redesigned. Therefore, the vehicle-mounted device provided in this embodiment of this application facilitates upgrading of the PCB (3).

Further, the first heat pipe (22) and the first protrusion (21) are disposed on two sides instead of a same side of the first temperature equalization board (2), so that the first heat pipe (22) is prevented from interfering with the first protrusion (21), thereby facilitating a high-density design of the first protrusion (21), and improving heat dissipation performance of the vehicle-mounted device.

To improve a heat dissipation effect, the first protrusion (21) may be in direct contact with the first heat emission component (31), or a thermally conductive member may be disposed between the first protrusion (21) and the first heat emission component (31). Similarly, the first temperature equalization board (2) may be in direct contact with the first inner wall (111), or a thermally conductive member may be disposed between the first temperature equalization board (2) and the first inner wall (111).

In a possible implementation, as shown in FIG. 1, the first protrusion (21) is in contact with the first heat emission component (31).

In the solution shown in this embodiment of this application, a plurality of first protrusions (21) may be disposed on the side that is of the first temperature equalization board (2) and that is close to the PCB (3), and a plurality of first heat emission components (31) may be disposed on the side that is of the PCB (3) and that is close to the first temperature equalization board (2).

A quantity of the plurality of first protrusions (21) may be equal to a quantity of the plurality of first heat emission components (31). In this case, each first protrusion (21) is in contact with one first heat emission component (31). Alternatively, a quantity of the plurality of first protrusions (21) may be less than a quantity of the plurality of first heat emission components (31). In this case, each first protrusion (21) may be in contact with one or more first heat emission components (31).

The first protrusion (21) is in direct contact with the first heat emission component (31) without disposing another additional component, so that a quantity of components included in the vehicle-mounted device is reduced, and assembly of the vehicle-mounted device is more convenient.

Figure 2:
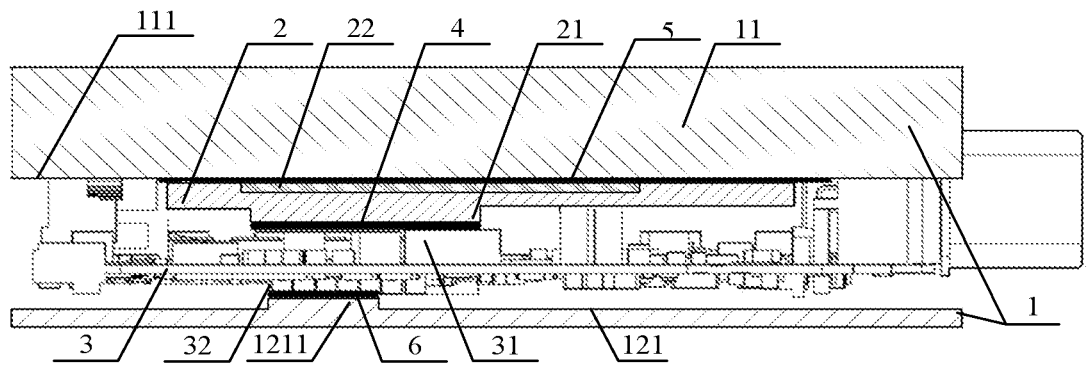
FIG. 2 is a schematic diagram of an internal structure of a vehicle-mounted device according to an embodiment of this application.

In a possible implementation, as shown in FIG. 2, the vehicle-mounted device further includes a first thermally conductive member (4), the first thermally conductive member (4) is disposed between the first heat emission component (31) and the first protrusion (21), and two sides of the first thermally conductive member (4) are respectively in contact with the first heat emission component (31) and the first protrusion (21).

The first thermally conductive member (4) may be a flexible thermally conductive member. Specifically, the first thermally conductive member (4) may be a thermally conductive pad, or may be a thermally conductive silicone grease film.

In the solution shown in this embodiment of this application, a plurality of first protrusions (21) may be disposed on the side that is of the first temperature equalization board (2) and that is close to the PCB (3), and a plurality of first heat emission components (31) may be disposed on the side that is of the PCB (3) and that is close to the first temperature equalization board (2).

A quantity of the plurality of first protrusions (21) may be equal to a quantity of the plurality of first heat emission components (31). In this case, each first protrusion (21) corresponds to a position of one first heat emission component (31). When the first thermally conductive member (4) is a thermally conductive pad, a thermally conductive pad is disposed between each first protrusion (21) and one first heat emission component (31). When the first thermally conductive member (4) is a thermally conductive silicone grease film, each first protrusion (21) may be coated with a layer of thermally conductive silicone grease film, each first heat emission component (31) may be coated with a layer of thermally conductive silicone grease film, or each first protrusion (21) and each first heat emission component (31) may be both coated with a layer of thermally conductive silicone grease film.

Alternatively, a quantity of the plurality of first protrusions (21) may be less than a quantity of the plurality of first heat emission components (31). In this case, each first protrusion (21) may correspond to a position of one or more first heat emission components (31). When the first thermally conductive member (4) is a thermally conductive pad, a thermally conductive pad may be disposed between each first protrusion (21) and one or more first heat emission components (31), and a size of the thermally conductive pad matches a size of a corresponding first protrusion (21). Alternatively, thermally conductive pads of a same quantity as the first heat emission components (31) may be disposed between each first protrusion (21) and one or more first heat emission components (31). In this case, a thermally conductive pad is disposed on each first heat emission component (31). When the first thermally conductive member (4) is a thermally conductive silicone grease film, each first protrusion (21) may be coated with a layer of thermally conductive silicone grease film, each first heat emission component (31) may be coated with a layer of thermally conductive silicone grease film, or each first protrusion (21) and each first heat emission component (31) may be both coated with a layer of thermally conductive silicone grease film.

The first thermally conductive member (4) is disposed between the first protrusion (21) and the first heat emission component (31), so that thermal conductivity between the first heat emission component (31) and the first protrusion (21) is improved, the heat generated by the first heat emission component (31) can be conducted to the first temperature equalization board (2) quickly, and heat dissipation efficiency of the vehicle-mounted device is improved.

In addition, the flexible first thermally conductive member (4) is disposed between the first protrusion (21) and the first heat emission component (31), so that a flatness error of the first protrusion (21) can be absorbed. That is, if the flexible first thermally conductive member (4) is not disposed between the first protrusion (21) and the first heat emission component (31), because a protrusion surface of the first protrusion (21) cannot be a totally flat plane, it is difficult for the first protrusion (21) to be in total contact with the first heat emission component (31), and a gap inevitably exists. The existing gap may be filled by adding the flexible first thermally conductive member (4), so that the first thermally conductive member (4) can absorb the flatness error of the first protrusion (21), and the first protrusion (21) and the first heat emission component (31) are closer to each other. In addition, the characteristic of filling the gap by using the first thermally conductive member (4) also improves thermal conductivity between the first protrusion (21) and the first heat emission component (31).

In a possible implementation, as shown in FIG. 1, the first temperature equalization board (2) is in contact with the first inner wall (111).

In the solution shown in this embodiment of this application, the first temperature equalization board (2) is in direct in contact with the first inner wall (111) without disposing another component, so that a quantity of components included in the vehicle-mounted device is reduced, and assembly of the vehicle-mounted device is more convenient.

In a possible implementation, as shown in FIG. 2, the vehicle-mounted device further includes a second thermally conductive member (5), the second thermally conductive member (5) is disposed between the first temperature equalization board (2) and the first inner wall (111), and two sides of the second thermally conductive member (5) are respectively in contact with the first temperature equalization board (2) and the first inner wall (111).

The second thermally conductive member (5) is a flexible thermally conductive member. Specifically, the second thermally conductive member (5) may be a thermally conductive pad, or may be a thermally conductive silicone grease film. There may be one second thermally conductive member (5). An area of the second thermally conductive member (5) may match an area of the side that is of the first temperature equalization board (2) and on which the first heat pipe (22) is disposed. Specifically, the area of the second thermally conductive member (5) is equal to the area of the side that is of the first temperature equalization board (2) and on which the first heat pipe (22) is disposed.

In the solution shown in this embodiment of this application, the second thermally conductive member (5) is disposed between the first inner wall (111) and the first temperature equalization board (2), so that thermal conductivity between the first inner wall (111) and the first temperature equalization board (2) is improved, and the heat on the first temperature equalization board (2) can be conducted to the first inner wall (111) quickly and then conducted to the housing (1), thereby improving heat dissipation efficiency of the vehicle-mounted device.

In addition, the flexible second thermally conductive member (5) is disposed between the first inner wall (111) and the first temperature equalization board (2), so that a flatness error between the first inner wall (111) and the first temperature equalization board (2) can be absorbed. That is, if the flexible second thermally conductive member (5) is not disposed between the first inner wall (111) and the first temperature equalization board (2), because a contact surface of the first inner wall (111) and the first temperature equalization board (2) cannot be a totally flat plane, it is difficult for the first inner wall (111) to be in total contact with the first temperature equalization board (2), and a gap inevitably exists. The existing gap may be filled by adding the flexible second thermally conductive member (5), so that the second thermally conductive member (5) can absorb the flatness error between the first inner wall (111) and the first temperature equalization board (2), and the first inner wall (111) and the first temperature equalization board (2) are closer to each other. In addition, the characteristic of filling the gap by using the second thermally conductive member (5) also improves thermal conductivity between the first inner wall (111) and the first temperature equalization board (2).

When the second thermally conductive member (5) is a thermally conductive pad, the thermally conductive pad needs to be placed between the first inner wall (111) and the first temperature equalization board (2) during assembly of the vehicle-mounted device. When the second thermally conductive member (5) is a thermally conductive silicone grease film, during assembly of the vehicle-mounted device, the first inner wall (111) needs to be coated with thermally conductive silicone grease, the side that is of the first temperature equalization board (2) and that is close to the first inner wall (111) needs to be coated with thermally conductive silicone grease, or both the first inner wall (111) and the first temperature equalization board (2) need to be coated with thermally conductive silicone grease.

In some cases, a second heat emission component (32) is further disposed on a side that is of the PCB (3) and that is close to the second inner wall (121). In this case, to facilitate heat dissipation of the second heat emission component (32), a corresponding heat dissipation structure may be disposed on a side of the second inner wall (121).

When the second heat emission component (32) has a relatively low heating power, In a possible implementation, a second heat emission component (32) is disposed on a side that is of the PCB (3) and that is close to the second inner wall (121). A second protrusion (1211) is disposed on the second inner wall (121). A position of the second protrusion (1211) corresponds to a position of the second heat emission component (32).

The second heat emission component (32) is a component that can generate heat and that is disposed on the side, of the PCB (3), close to the second inner wall (121). Specifically, the second heat emission component (32) may be various chips, capacitors, and resistors. In a possible implementation, the second heat emission component (32) is all components that can generate heat and that are on the side, of the PCB (3), close to the second inner wall (121). In this case, a corresponding second protrusion (1211) needs to be disposed on the second inner wall (121) for each component that generates heat. In another possible implementation, the second heat emission component (32) is a component whose heating power is greater than the target power threshold and that is on the side, of the PCB (3), close to the second inner wall (121). In this case, a corresponding second protrusion (1211) needs to be disposed on the second inner wall (121) only for the component whose heating power is greater than the preset power threshold. Optionally, the preset power threshold is 100 W.

The second protrusion (1211) is a protrusion on the second inner wall (121), and there may be a plurality of second protrusions (1211). The second protrusion (1211) is in direct contact with the second heat emission component (32) or is in contact with the second heat emission component (32) by using a thermally conductive member, to conduct heat generated by the second heat emission component (32) to the housing (1).

A quantity of second protrusions (1211) may be equal to a quantity of second heat emission components (32). In this case, a position of each second protrusion (1211) corresponds to a position of one second heat emission component (32). Alternatively, a quantity of second protrusions (1211) may be less than a quantity of second heat emission components (32). In this case, a position of each second protrusion (1211) corresponds to a position of one or more second heat emission components (32).

In the solution shown in this embodiment of this application, the second protrusion (1211) is disposed on the second inner wall (121), so that the heat generated by the second heat emission component (32) can be conducted to the housing (1) by using the second protrusion (1211), thereby accelerating heat dissipation of the second heat emission component (32), and improving heat dissipation efficiency of the vehicle-mounted device.

To improve a heat dissipation effect, the second protrusion (1211) may be in direct contact with the second heat emission component (32), or a thermally conductive member may be disposed between the second protrusion (1211) and the second heat emission component (32).

In a possible implementation, as shown in FIG. 2, the second protrusion (1211) is in contact with the second heat emission component (32).

In the solution shown in this embodiment of this application, a plurality of second protrusions (1211) may be disposed on the second inner wall (121), and a plurality of second heat emission components (32) are disposed on the side that is of the PCB (3) and that is close to the second inner wall (121).

A quantity of the plurality of second protrusions (1211) may be equal to a quantity of the plurality of second heat emission components (32). In this case, each second protrusion (1211) is in contact with one second heat emission component (32). Alternatively, a quantity of the plurality of second protrusions (1211) may be less than a quantity of the plurality of second heat emission components (32). In this case, each second protrusion (1211) may be in contact with one or more second heat emission components (32).

The second protrusion (1211) is in direct contact with the second heat emission component (32) without disposing another additional component, so that a quantity of components included in the vehicle-mounted device is reduced, and assembly of the vehicle-mounted device is more convenient.

In a possible implementation, as shown in FIG. 2, the vehicle-mounted device further includes a third thermally conductive member (6), the third thermally conductive member (6) is disposed between the second protrusion (1211) and the second heat emission component (32), and two sides of the third thermally conductive member (6) are respectively in contact with the second protrusion (1211) and the second heat emission component (32).

The third thermally conductive member (6) may be a flexible thermally conductive member. Specifically, the third thermally conductive member (6) may be a thermally conductive pad, or may be a thermally conductive silicone grease film.

In the solution shown in this embodiment of this application, a plurality of second protrusions (1211) may be disposed on the second inner wall (121), and a plurality of second heat emission components (32) are disposed on the side that is of the PCB (3) and that is close to the second inner wall (121).

A quantity of the plurality of second protrusions (1211) may be equal to a quantity of the plurality of second heat emission components (32). In this case, each second protrusion (1211) corresponds to a position of one second heat emission component (32). When the third thermally conductive member (6) is a thermally conductive pad, a thermally conductive pad is disposed between each second protrusion (1211) and one second heat emission component (32). When the third thermally conductive member (6) is a thermally conductive silicone grease film, each second protrusion (1211) may be coated with a layer of thermally conductive silicone grease film, each second heat emission component (32) may be coated with a layer of thermally conductive silicone grease film, or each second protrusion (1211) and each second heat emission component (32) may be both coated with a layer of thermally conductive silicone grease film.

Alternatively, a quantity of the plurality of second protrusions (1211) may be less than a quantity of the plurality of second heat emission components (32). In this case, each second protrusion (1211) may correspond to a position of one or more second heat emission components (32). When the third thermally conductive member (6) is a thermally conductive pad, a thermally conductive pad may be disposed between each second protrusion (1211) and one or more second heat emission components (32), and a size of the thermally conductive pad matches a size of a corresponding second protrusion (1211). Alternatively, thermally conductive pads of a same quantity as the second heat emission components (32) may be disposed between each second protrusion (1211) and one or more second heat emission components (32). In this case, a thermally conductive pad is disposed on each second heat emission component (32). When the third thermally conductive member (6) is a thermally conductive silicone grease film, each second protrusion (1211) may be coated with a layer of thermally conductive silicone grease film, each second heat emission component (32) may be coated with a layer of thermally conductive silicone grease film, or each second protrusion (1211) and each second heat emission component (32) may be both coated with a layer of thermally conductive silicone grease film.

In addition, the flexible third thermally conductive member (6) is disposed between the second protrusion (1211) and the second heat emission component (32), so that a flatness error of the second protrusion (1211) can be absorbed. That is, if the flexible third thermally conductive member (6) is not disposed between the second protrusion (1211) and the second heat emission component (32), because a protrusion surface of the second protrusion (1211) cannot be a totally flat plane, it is difficult for the second protrusion (1211) to be in total contact with the second heat emission component (32), and a gap inevitably exists. The existing gap may be filled by adding the flexible third thermally conductive member (6), so that the third thermally conductive member (6) can absorb the flatness error of the second protrusion (1211), and the second protrusion (1211) and the second heat emission component (32) are closer to each other. In addition, the characteristic of filling the gap by using the third thermally conductive member (6) also improves thermal conductivity between the second protrusion (1211) and the second heat emission component (32).

When the second heat emission component (32) has a relatively high heating power, In a possible implementation, the vehicle-mounted device further includes a second temperature equalization board (7). The second temperature equalization board (7) is fastened between the PCB (3) and the second inner wall (121). A second heat emission component (32) is disposed on a side that is of the PCB (3) and that is close to the second temperature equalization board (7). A second heat pipe (71) is disposed on a side that is of the second temperature equalization board (7) and that is close to the second inner wall (121), and a third protrusion (72) is disposed on a side that is of the second temperature equalization board (7) and that is close to the PCB (3). A position of the third protrusion (72) corresponds to a position of the second heat emission component (32).

The second temperature equalization board (7) is a thermally conductive board with the third protrusion (72) disposed on one side and the second heat pipe (71) disposed on the other side. For details, refer to FIG. 4 and FIG. 5. A board body of the temperature equalization board may be made of aluminum. A size of the second temperature equalization board (7) matches a layout of the second heat emission component (32), and the second temperature equalization board (7) may cover all second heat emission components (32).

Similar to the first heat pipe (22), the second heat pipe (71) is a heat pipe used for thermal conduction, namely, a heat transfer element produced by using a heat pipe technology. The second heat pipe (71) has a strong thermal conduction capability, and can quickly disperse, on each part of the second temperature equalization board (7), heat conducted to the second temperature equalization board (7). In a possible implementation, there are a plurality of second heat pipes (71). An arrangement manner of the second heat pipe (71) on the second temperature equalization board (7) may be that the second heat pipe (71) passes through a high-temperature second heat emission component (32), that is, the second heat pipe (71) directly faces one or more second heat emission components (32) whose heating powers are greater than the target power threshold. In other words, when the vehicle-mounted device is assembled, the second heat pipe (71) is directly located above or below the one or more second heat emission components (32) whose heating powers are greater than the target power threshold. The second heat pipe (71) may be welded or crimped to the board body of the second temperature equalization board (7).

The third protrusion (72) is a protrusion on the second temperature equalization board (7), and there may be a plurality of third protrusions (72). The third protrusion (72) is in direct contact with the second heat emission component (32) or is in contact with the second heat emission component (32) by using a thermally conductive member, to conduct heat generated by the second heat emission component (32) to the second temperature equalization board (7).

A quantity of third protrusions (72) may be equal to a quantity of second heat emission components (32). In this case, a position of each third protrusion (72) corresponds to a position of one second heat emission component (32). Alternatively, a quantity of third protrusions (72) may be less than a quantity of second heat emission components (32). In this case, a position of each third protrusion (72) corresponds to a position of one or more second heat emission components (32).

In the solution shown in this embodiment of this application, when the second heat emission component (32) has relatively high heating power, the second temperature equalization board (7) is disposed between the second inner wall (121) and the PCB (3), thereby improving heat dissipation efficiency on the second heat emission component (32).

In the solution shown in this embodiment of this application, the first temperature equalization board (2) and the second temperature equalization board (7) are added inside the vehicle-mounted device provided in this embodiment of this application, the first heat pipe (22) is disposed on the first temperature equalization board (2), and the second heat pipe (71) is disposed on the second temperature equalization board (7), so that the first heat pipe (22) and the second heat pipe (71) are not in direct contact with the external environment, thereby reducing a possibility that the first heat pipe (22) and the second heat pipe (71) are damaged. Even if vehicle-mounted device is in an external corrosive environment, the first heat pipe (22) and the second heat pipe (71) are not easily damaged. Therefore, the vehicle-mounted device provided in this embodiment of this application can meet a corrosion-resistance requirement in an outdoor environment. In addition, because the first heat pipe (22) disperses the heat conducted to the first temperature equalization board (2), and the second heat pipe (71) disperses the heat conducted to the second temperature equalization board (7), the heat conducted to the housing (1) is relatively even, and the heat is also dissipated to the external environment quickly, that is, heat dissipation efficiency of the vehicle-mounted device is relatively high.

Next, in a related technology, a heat pipe generally needs to be welded to a housing of a vehicle-mounted device. A specific technology is as follows: First, tinning is performed in a solder bath of the housing, and then the heat pipe is welded to the solder bath by using a soldering technology. To enhance corrosion resistance of the housing, paint usually needs to be baked on the housing. Because temperature of paint baking is about 200° C., and a melting point of tin is about 120° C., the previous solder is usually melted during paint baking, causing an unstable connection between the heat pipe and the housing. As a result, the vehicle-mounted device in the related technology has poor machinability. However, because no heat pipe is disposed on the housing (1) of the vehicle-mounted device provided in this embodiment of this application, baking paint on the housing (1) has no adverse impact. In addition, because the first temperature equalization board (2) and the second temperature equalization board (7) are disposed inside the vehicle-mounted device, paint does not need to be baked on the first temperature equalization board (2) and the second temperature equalization board (7). Therefore, welding between the first heat pipe (22) and the board body of the first temperature equalization board (2) and welding between the second heat pipe (21) and the board body of the second temperature equalization board (7) are not affected, and a connection between the first heat pipe (22) and the board body of the first temperature equalization board (2) and a connection between the second heat pipe (21) and the board body of the second temperature equalization board (7) are relatively stable. Therefore, the vehicle-mounted device provided in this embodiment of this application has better machinability.

In addition, the vehicle-mounted device provided in this embodiment of this application also facilitates upgrading of the PCB (3). That is, when the PCB (3) needs to be upgraded, arrangement and quantities of first heat emission components (31) and second heat emission components (32) on the PCB (3) may change. In this case, only the first temperature equalization board (2) and/or the second temperature equalization board (7) need/needs to be replaced. Therefore, only the first temperature equalization board (2) and/or the second temperature equalization board (7) need/needs to be redesigned, and the entire vehicle-mounted device does not need to be redesigned. Therefore, the vehicle-mounted device provided in this embodiment of this application facilitates upgrading of the PCB (3).

Further, the second heat pipe (71) and the third protrusion (72) are disposed on two sides of the second temperature equalization board (7), so that the second heat pipe (71) is prevented from interfering with the third protrusion (72), thereby facilitating a high-density design of the third protrusion (72), and improving heat dissipation performance of the vehicle-mounted device.

To improve a heat dissipation effect, the third protrusion (72) may be in direct contact with the second heat emission component (32), or may be in contact with the second heat emission component (32) by using a thermally conductive pad. Similarly, the second temperature equalization board (7) may be in direct contact with the second inner wall (121), or may be in contact with the second inner wall (121) by using a thermally conductive pad.

In a possible implementation, the third protrusion (72) is in contact with the second heat emission component (32).

In the solution shown in this embodiment of this application, a plurality of third protrusions (72) may be disposed on the side that is of the second temperature equalization board (7) and that is close to the PCB (3), and a plurality of second heat emission components (32) may be disposed on the side that is of the PCB (3) and that is close to the second temperature equalization board (7).

A quantity of the plurality of third protrusions (72) may be equal to a quantity of the plurality of second heat emission components (32). In this case, each third protrusion (72) is in contact with one second heat emission component (32).

Alternatively, a quantity of the plurality of third protrusions (72) may be less than a quantity of the plurality of second heat emission components (32). In this case, each third protrusion (72) may be in contact with one or more second heat emission components (32).

The third protrusion (72) is in direct contact with the second heat emission component (32) without disposing another additional component, so that a quantity of components included in the vehicle-mounted device is reduced, and assembly of the vehicle-mounted device is more convenient.

In a possible implementation, the vehicle-mounted device further includes a fourth thermally conductive member (8), the fourth thermally conductive member (8) is disposed between the third protrusion (72) and the second heat emission component (32), and two sides of the fourth thermally conductive member (8) are respectively in contact with the third protrusion (72) and the second heat emission component (32).

The fourth thermally conductive member (8) may be a flexible thermally conductive member. Specifically, the fourth thermally conductive member (8) may be a thermally conductive pad, or may be a thermally conductive silicone grease film.

In the solution shown in this embodiment of this application, a plurality of third protrusions (72) may be disposed on the side that is of the second temperature equalization board (7) and that is close to the PCB (3), and a plurality of second heat emission components (32) may be disposed on the side that is of the PCB (3) and that is close to the second temperature equalization board (7).

A quantity of the plurality of third protrusions (72) may be equal to a quantity of the plurality of second heat emission components (32). In this case, each third protrusion (72) corresponds to a position of one second heat emission component (32). When the fourth thermally conductive member (8) is a thermally conductive pad, a thermally conductive pad is disposed between each third protrusion (72) and one second heat emission component (32). When the fourth thermally conductive member (8) is a thermally conductive silicone grease film, each third protrusion (72) may be coated with a layer of thermally conductive silicone grease film, each second heat emission component (32) may be coated with a layer of thermally conductive silicone grease film, or each third protrusion (72) and each second heat emission component (32) may be both coated with a layer of thermally conductive silicone grease film.

Alternatively, a quantity of the plurality of third protrusions (72) may be less than a quantity of the second heat emission components (32). In this case, each third protrusion (72) may correspond to a position of one or more second heat emission components (32). When the fourth thermally conductive member (8) is a thermally conductive pad, a thermally conductive pad may be disposed between each third protrusion (72) and one or more second heat emission components (32), and a size of the thermally conductive pad matches a size of a corresponding third protrusion (72). Alternatively, thermally conductive pads of a same quantity as the second heat emission components (32) may be disposed between each third protrusion (72) and one or more second heat emission components (32). In this case, a thermally conductive pad is disposed on each second heat emission component (32). When the fourth thermally conductive member (8) is a thermally conductive silicone grease film, each third protrusion (72) may be coated with a layer of thermally conductive silicone grease film, each second heat emission component (32) may be coated with a layer of thermally conductive silicone grease film, or each third protrusion (72) and each second heat emission component (32) may be both coated with a layer of thermally conductive silicone grease film.

The fourth thermally conductive member (8) is disposed between the third protrusion (72) and the second heat emission component (32), so that thermal conductivity between the second heat emission component (32) and the third protrusion (72) is improved, the heat generated by the second heat emission component (32) can be conducted to the second temperature equalization board (7) quickly, and heat dissipation efficiency of the vehicle-mounted device is improved.

In addition, the flexible fourth thermally conductive member (8) is disposed between the third protrusion (72) and the second heat emission component (32), so that a flatness error of the third protrusion (72) can be absorbed. That is, if the flexible fourth thermally conductive member (8) is not disposed between the third protrusion (72) and the second heat emission component (32), because a protrusion surface of the third protrusion (72) cannot be a totally flat plane, it is difficult for the third protrusion (72) to be in total contact with the second heat emission component (32), and a gap inevitably exists. The existing gap may be filled by adding the flexible fourth thermally conductive member (8), so that the fourth thermally conductive member (8) can absorb the flatness error of the third protrusion (72), and the third protrusion (72) and the second heat emission component (32) are closer to each other. In addition, the characteristic of filling the gap by using the fourth thermally conductive member (8) also improves thermal conductivity between the third protrusion (72) and the second heat emission component (32).

In a possible implementation, the second temperature equalization board (7) is in contact with the second inner wall (121).

In the solution shown in this embodiment of this application, the second temperature equalization board (7) is in direct in contact with the second inner wall (121) without disposing another component, so that a quantity of components included in the vehicle-mounted device is reduced, and assembly of the vehicle-mounted device is more convenient.

In a possible implementation, the vehicle-mounted device further includes a fifth thermally conductive member (9), the fifth thermally conductive member (9) is disposed between the second temperature equalization board (7) and the second inner wall (121), and two sides of the fifth thermally conductive member (9) are respectively in contact with the second temperature equalization board (7) and the second inner wall (121).

The fifth thermally conductive member (9) is a flexible thermally conductive member. Specifically, the fifth thermally conductive member (9) may be a thermally conductive pad, or may be a thermally conductive silicone grease film. There may be one fifth thermally conductive member (9). A surface area of the fifth thermally conductive member (9) may match an area of the side that is of the second temperature equalization board (7) and on which the second heat pipe (71) is disposed. Specifically, the area of the fifth thermally conductive member (9) is equal to the area of the side that is of the second temperature equalization board (7) and on which the second heat pipe (71) is disposed.

In the solution shown in this embodiment of this application, the fifth thermally conductive member (9) is disposed between the second inner wall (121) and the second temperature equalization board (7), so that thermal conductivity between the second inner wall (121) and the second temperature equalization board (7) is improved, and the heat on the second temperature equalization board (7) can be conducted to the second inner wall (121) quickly and then conducted to the housing (1), thereby improving heat dissipation efficiency of the vehicle-mounted device.

In addition, the flexible fifth thermally conductive member (9) is disposed between the second inner wall (121) and the second temperature equalization board (7), so that a flatness error between the second inner wall (121) and the second temperature equalization board (7) can be absorbed. That is, if the flexible fifth thermally conductive member (9) is not disposed between the second inner wall (121) and the second temperature equalization board (7), because a contact surface of the second inner wall (121) and the second temperature equalization board (7) cannot be a totally flat plane, it is difficult for the second inner wall (121) to be in total contact with the second temperature equalization board (7), and a gap inevitably exists. The existing gap may be filled by adding the flexible fifth thermally conductive member (9), so that the fifth thermally conductive member (9) can absorb the flatness error between the second inner wall (121) and the second temperature equalization board (7), and the second inner wall (121) and the second temperature equalization board (7) are closer to each other. In addition, the characteristic of filling the gap by using the fifth thermally conductive member (9) also improves thermal conductivity between the second inner wall (121) and the second temperature equalization board (7).

When the fifth thermally conductive member (9) is a thermally conductive pad, the thermally conductive pad needs to be placed between the second inner wall (121) and the second temperature equalization board (7) during assembly of the vehicle-mounted device. When the fifth thermally conductive member (9) is a thermally conductive silicone grease film, during assembly of the vehicle-mounted device, the second inner wall (121) needs to be coated with thermally conductive silicone grease, the side that is of the second temperature equalization board (7) and that is close to the second inner wall (121) needs to be coated with thermally conductive silicone grease, or both the second inner wall (121) and the second temperature equalization board (7) need to be coated with thermally conductive silicone grease.

The following describes a connection manner between the components of the vehicle-mounted device.

In a possible implementation, the housing (1) includes the first housing part (11) and the second housing part (12), and the first housing part (11) and the second housing part (12) are fixedly connected. The first inner wall (111) is located on the first housing part (11), and the second inner wall (121) is located on the second housing part (12).

In the solution shown in this embodiment of this application, the first temperature equalization board (2) may be fastened to the first housing part (11), and the PCB (3) may be fastened to the second housing part. Then, the first housing part (11) and the second housing part (12) are fixedly connected, to complete assembly of the entire vehicle-mounted device.

It should be noted that when the vehicle-mounted device includes the second temperature equalization board (7), the second temperature equalization board (7) may be fastened to the second housing part (12).

In a possible implementation, the first temperature equalization board (2) and the first inner wall (111) are fixedly connected.

Figure 9:
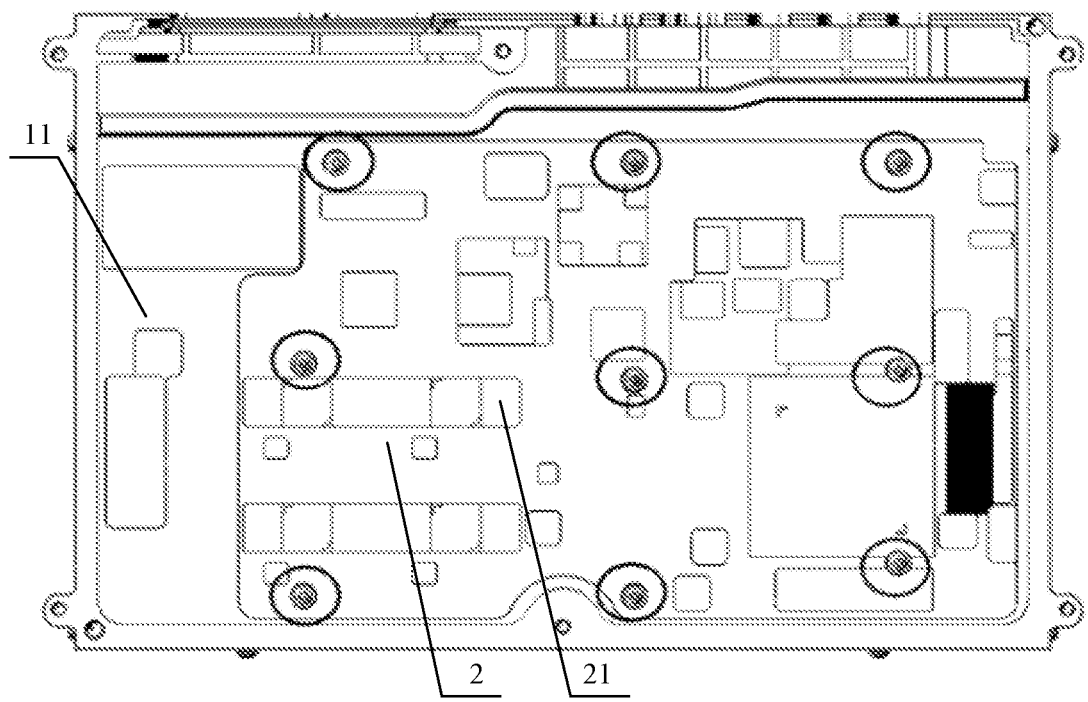
FIG. 9 is a schematic diagram of installation of a first temperature equalization board (2) according to an embodiment of this application.

In the solution shown in this embodiment of this application, the first temperature equalization board (2) and the first inner wall (111) are fixedly connected to each other by using a screw, that is, the first temperature equalization board (2) is fastened to an inner wall of the first housing part (11) by using a screw (as shown in FIG. 9, the screw is circled in FIG. 9).

Correspondingly, when the vehicle-mounted device includes the second temperature equalization board (7), the second temperature equalization board (7) and the second inner wall (121) may be fixedly connected to each other by using a screw, that is, the second temperature equalization board (7) is fastened to an inner wall of the second housing part (12) by using a screw.

The first temperature equalization board (2) and the second temperature equalization board (7) are fastened by using screws, so that the first temperature equalization board (2) and the second temperature equalization board (7) have better detachability. Therefore, it is convenient to replace a corresponding temperature equalization board when the PCB (3) is upgraded or the temperature equalization board is damaged.

Figure 10:
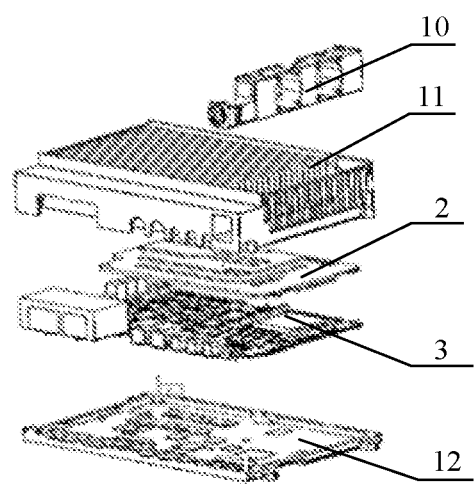
FIG. 10 is an exploded diagram of a vehicle-mounted device according to an embodiment of this application.
Figure 11:
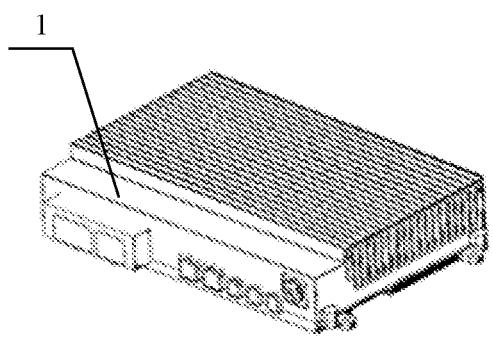
FIG. 11 is an outline drawing of a vehicle-mounted device according to an embodiment of this application.
Figure 12:
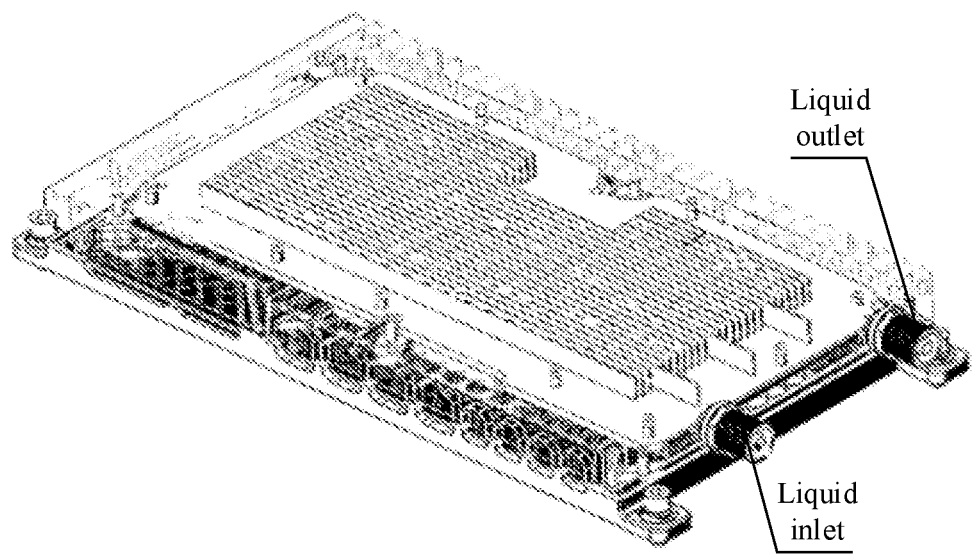
FIG. 12 is a schematic diagram of a liquid-cooling vehicle-mounted device according to an embodiment of this application.

In a possible implementation, as shown in FIG. 10 and FIG. 11, a plurality of fins are disposed on an outer wall of the first housing part (11).

The fins may also be referred to as heat sinks, and the fins are metallic plates. The fins are disposed on the first housing part (11), so that a heat dissipation area of the first housing part (11) can be increased, thereby improving heat dissipation efficiency of the vehicle-mounted device.

In the solution shown in this embodiment of this application, a plurality of fins are disposed on the outer wall of the first housing part (11), so that the heat dissipation area of the first housing part (11) is increased, thereby improving heat dissipation efficiency of the vehicle-mounted device.

When the second heat emission component (32) has a relatively small heating power, fins may not need to be disposed on an outer wall of the second housing part (12), thereby reducing a difficulty of a technology of producing the second housing part (12), and reducing a cost. When the second heat emission component (32) has a relatively large heating power, fins may also be disposed on an outer wall of the second housing part (12), thereby improving heat dissipation efficiency of the vehicle-mounted device.

The vehicle-mounted device shown in this embodiment of this application may be an air-cooling vehicle-mounted device, or may be a liquid-cooling vehicle-mounted device. The following describes the two cases.

In a possible implementation, the vehicle-mounted device further includes a fan (10), and the fan (10) is fastened to an outer wall of the housing (1). The fan (10) is configured to accelerate heat dissipation of the housing (1).

In the solution shown in this embodiment of this application, the vehicle-mounted device provided in this embodiment of this application may be a natural air-cooling vehicle-mounted device, or may be a mechanical air-cooling vehicle-mounted device.

When the vehicle-mounted device is a mechanical air-cooling vehicle-mounted device, the vehicle-mounted device may further include a fan (10), and the fan (10) is installed on the outer wall of the housing (1), and accelerates heat dissipation of the housing (1) by blowing air. In a possible implementation, the fan (10) is installed on the first housing part (11), an installation slot is disposed on an outer wall of the first housing part (11), the fan (10) is installed in the installation slot, and air blown by the fan (10) accelerates heat dissipation of fins.

It should be noted that another case exists: When the vehicle-mounted device is a mechanical air-cooling vehicle-mounted device, the vehicle-mounted device may not include a fan. In this case, the vehicle-mounted device performs mechanical air cooling by using a fan included in the vehicle.

In a possible implementation, a sealed cavity is formed between the first inner wall (111) and the first temperature equalization board (2), and the sealed cavity is configured to hold coolant. A liquid inlet and a liquid outlet are disposed on the sealed cavity.

The coolant may be water. The liquid inlet is configured to enable the coolant to flow in, and the liquid outlet is configured to enable the coolant to flow out.

In the solution shown in this embodiment of this application, the vehicle-mounted device provided in this embodiment of this application may not include a liquid cooling apparatus, but uses a liquid cooling apparatus included in the vehicle. During installation, a liquid outlet pipe of the liquid cooling apparatus is connected to the liquid inlet of the sealed cavity, and a liquid return pipe of the liquid cooling apparatus is connected to the liquid outlet of the sealed cavity. During working, a working process of a cooling part of the vehicle-mounted device is as follows: The coolant absorbs heat to become coolant with relatively high temperature, then enters the liquid cooling apparatus for cooling by using the liquid outlet and the liquid return pipe to become coolant with relatively low temperature, and re-enters the sealed cavity by using the liquid outlet pipe and the liquid inlet to absorb heat generated by the vehicle-mounted device.

Heat dissipation is performed for the vehicle-mounted device provided in this application through liquid cooling. Liquid-cooling heat dissipation has a better effect than air-cooling heat dissipation.

Figure 13:
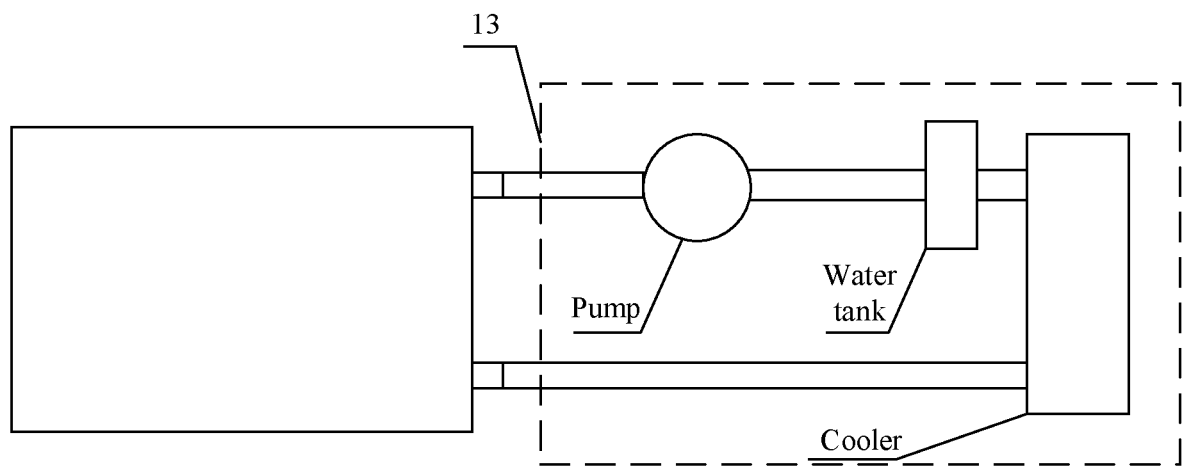
FIG. 13 is a schematic diagram of a liquid-cooling vehicle-mounted device according to an embodiment of this application.

In a possible implementation, as shown in FIG. 13, the vehicle-mounted device further includes a liquid cooling apparatus (13), and the liquid cooling apparatus (13) includes a liquid outlet pipe and a liquid return pipe. The liquid outlet pipe is connected to the liquid inlet, and the liquid return pipe is connected to the liquid outlet.

The liquid cooling apparatus may be a conventional cooling apparatus.

In the solution shown in this embodiment of this application, the vehicle-mounted device provided in this embodiment of this application may further include a liquid cooling apparatus. The liquid outlet pipe of the liquid cooling apparatus is connected to the liquid inlet of the sealed cavity, and the liquid return pipe of the liquid cooling apparatus is connected to the liquid outlet of the sealed cavity. During working, a working process of a cooling part of the vehicle-mounted device is as follows: The coolant absorbs heat to become coolant with relatively high temperature, then enters the liquid cooling apparatus for cooling by using the liquid outlet and the liquid return pipe to become coolant with relatively low temperature, and re-enters the sealed cavity by using the liquid outlet pipe and the liquid inlet to absorb heat generated by the vehicle-mounted device.

The liquid cooling apparatus includes a pump, a water tank, and a cooler, and the components are connected to each other by using a pipeline. For a specific connection manner, refer to FIG. 13.

Heat dissipation is performed for the vehicle-mounted device provided in this embodiment of this application through liquid cooling. Liquid-cooling heat dissipation has a better effect than air-cooling heat dissipation.

An embodiment of this application further provides a vehicle, where the vehicle is installed with the vehicle-mounted device in any one of the foregoing implementations.

The vehicle may be any vehicle in which a vehicle-mounted device may be installed.

In the solution shown in this embodiment of this application, the foregoing vehicle-mounted device is installed, so that the vehicle-mounted device has relatively high heat dissipation efficiency. Therefore, computing power of the vehicle-mounted device can be greatly improved, thereby further facilitating implementation of self-driving of the vehicle.

For descriptions of the vehicle-mounted device, refer to the foregoing content. Details are not described herein again.

The foregoing descriptions are merely specific embodiments of this application, but are not intended to limit this application. Any modification, equivalent replacement, or improvement made without departing from the principle of this application should fall within the protection scope of this application.

What is claimed is:

1. A vehicle-mount able device, wherein the vehicle-mountable device comprises a housing, a first temperature equalization board, a second temperature equalization board, and a PCB, wherein:
   the first temperature equalization board and the PCB are fastened inside the housing, the first temperature equalization board is disposed on a first inner wall of the housing, the PCB is disposed on a second inner wall of the housing, and the first inner wall is opposite to the second inner wall;
   a first protrusion is disposed on a side of the first temperature equalization board that is facing the PCB, and a first heat pipe is disposed on a side of the first temperature equalization board that is facing the first inner wall;
   a first heat emission component is disposed on a side of the PCB and that is facing the first temperature equalization board;
   a position of the first protrusion corresponds to a position of the first heat emission component;
   the second temperature equalization board is fastened between the PCB and the second inner wall;
   a second heat emission component is disposed on a side of the PCB that is facing the second temperature equalization board;
   a second heat pipe is disposed on a side of the second temperature equalization board that is facing the second inner wall, and a second protrusion is disposed on a side of the second temperature equalization board that is facing the PCB; and
   a position of the second protrusion corresponds to a position of the second heat emission component.

2. The vehicle-mountable device according to claim 1, wherein the first protrusion is in contact with the first heat emission component.

3. The vehicle-mountable device according to claim 1, wherein the vehicle-mountable device further comprises a first thermally conductive member, the first thermally conductive member is disposed between the first heat emission component and the first protrusion, and two sides of the first thermally conductive member are respectively in contact with the first heat emission component and the first protrusion.

4. The vehicle-mountable device according to claim 1, wherein the first temperature equalization board is in contact with the first inner wall.

5. The vehicle-mountable device according to claim 1, wherein the vehicle-mountable device further comprises a second thermally conductive member, the second thermally conductive member is disposed between the first temperature equalization board and the first inner wall, and two sides of the second thermally conductive member are respectively in contact with the first temperature equalization board and the first inner wall.

6. The vehicle-mountable device according to claim 1, wherein the second third protrusion is in contact with the second heat emission component.

7. The vehicle-mountable device according to claim 1, wherein the vehicle-mountable device further comprises a fourth thermally conductive member, the fourth thermally conductive member is disposed between the second protrusion and the second heat emission component, and two sides of the fourth thermally conductive member are respectively in contact with the second protrusion and the second heat emission component.

8. The vehicle-mountable device according to claim 1, wherein the second temperature equalization board is in contact with the second inner wall.

9. The vehicle-mountable device according to claim 1, wherein the vehicle-mountable device further comprises a third thermally conductive member, the third thermally conductive member is disposed between the second temperature equalization board and the second inner wall, and two sides of the third thermally conductive member are respectively in contact with the second temperature equalization board and the second inner wall.

10. The vehicle-mountable device according to claim 1, wherein the first heat pipe directly faces the first heat emission component whose heating power is greater than 100 W.

11. The vehicle-mountable device according to claim 1, wherein a quantity of first protrusions is less than a quantity of first heat emission components, and a position of each first protrusion corresponds to a position of one or more first heat emission components.

12. The vehicle-mountable device according to claim 1, wherein the housing comprises a first housing part and a second housing part, and the first housing part and the second housing part are fixedly connected; and
the first inner wall is located on the first housing part, and the second inner wall is located on the second housing part.

13. The vehicle-mountable device according to claim 12, wherein the first temperature equalization board and the first inner wall are fixedly connected.

14. The vehicle-mountable device according to claim 12, wherein a plurality of fins are disposed on an outer wall of the first housing part.

15. The vehicle-mountable device according to claim 1, wherein the vehicle-mountable device further comprises a fan, and the fan is fastened to an outer wall of the housing; and
the fan is configured to accelerate heat dissipation of the housing.

16. The vehicle-mountable device according to claim 1, wherein a sealed cavity is formed between the first inner wall and the first temperature equalization board, and the sealed cavity is configured to hold coolant; and
a liquid inlet and a liquid outlet are disposed on the sealed cavity. wherein the vehicle-mountable device further comprises a liquid cooling apparatus, and the liquid cooling apparatus comprises a liquid outlet pipe and a liquid return pipe; and
the liquid outlet pipe is connected to the liquid inlet, and the liquid return pipe is connected to the liquid outlet.

\* \* \* \* \*